United States Patent
Mayfield et al.

(10) Patent No.: US 9,366,744 B2
(45) Date of Patent: Jun. 14, 2016

(54) INSTRUMENT TRANSFORMER TEST EQUIPMENT AND METHOD

(75) Inventors: Glenn A. Mayfield, Lafayette, IN (US); Matthew Eric Kraus, Jamestown, IN (US); David Andrew Bobick, West Lafayette, IN (US); Timothy C. Everidge, legal representative, Lafayette, IN (US)

(73) Assignee: Radian Research, Inc., Lafayette, IN (US)

( * ) Notice: Subject to any disclaimer, the term of this patent is extended or adjusted under 35 U.S.C. 154(b) by 1546 days.

(21) Appl. No.: 12/673,212

(22) PCT Filed: Aug. 12, 2008

(86) PCT No.: PCT/US2008/072873
§ 371 (c)(1),
(2), (4) Date: Oct. 19, 2011

(87) PCT Pub. No.: WO2009/026038
PCT Pub. Date: Feb. 26, 2009

(65) Prior Publication Data
US 2012/0139555 A1    Jun. 7, 2012

Related U.S. Application Data

(60) Provisional application No. 60/956,322, filed on Aug. 16, 2007.

(51) Int. Cl.
| | |
|---|---|
| *G01R 31/02* | (2006.01) |
| *G01R 35/02* | (2006.01) |
| *G01R 1/20* | (2006.01) |
| G01R 29/20 | (2006.01) |

(52) U.S. Cl.
CPC ............. *G01R 35/02* (2013.01); *G01R 1/203* (2013.01); *G01R 31/027* (2013.01); *G01R 29/20* (2013.01)

(58) Field of Classification Search
CPC ..... G01R 31/027; G01R 29/20; G01R 31/2825
USPC ............... 324/546–547, 555, 750.01–750.02; 340/646
See application file for complete search history.

(56) References Cited

U.S. PATENT DOCUMENTS

| 5,717,338 A * | 2/1998 | Cook ........................... 324/546 |
| 6,160,697 A | 12/2000 | Edel |

(Continued)

FOREIGN PATENT DOCUMENTS

| DE | 27 00 081 A1 | 7/1978 |
| EP | 0 982 596 A1 | 3/2000 |

(Continued)

OTHER PUBLICATIONS

Supplementary European search report from related EP 08 79 7677 dated Apr. 15, 2013, 7 pages.

(Continued)

*Primary Examiner* — Vincent Q Nguyen
(74) *Attorney, Agent, or Firm* — Barnes & Thornburg LLP

(57) ABSTRACT

A method and apparatus for testing a transformer. A controller generates a switching signal and supplies the switching signal to a solid state switch in circuit with a test load of known magnitude, switching the solid state switch to place the test load in circuit with the transformer. A signal through or across the transformer is then measured. Methods and apparatus for testing a transformer comprise the controller and solid state switch placing a series of test loads of different known magnitudes in circuit with the transformer from the lowest magnitude to the highest, from the highest to the lowest, or both. Additionally, a test load array comprises a plurality of power resistors, a heat sink for accommodating the plurality of power resistors, and a material providing electrical insulation of the power resistors from the heat sink and thermal conductivity between the power resistors and the heat sink.

15 Claims, 22 Drawing Sheets

(56) References Cited

U.S. PATENT DOCUMENTS

| | | | |
|---|---|---|---|
| 6,249,123 B1 | 6/2001 | Rankin | |
| 6,522,517 B1 * | 2/2003 | Edel | 361/143 |
| 6,587,050 B2 | 7/2003 | Owen | |
| 6,653,846 B2 | 11/2003 | James | |
| 6,680,616 B2 * | 1/2004 | Khalin et al. | 324/547 |
| 6,987,390 B2 * | 1/2006 | Suss et al. | 324/547 |
| 7,303,602 B2 | 12/2007 | Gregoire | |
| 2002/0109507 A1 | 8/2002 | Khalin et al. | |
| 2003/0080741 A1 * | 5/2003 | LeRow et al. | 324/320 |

FOREIGN PATENT DOCUMENTS

| | | | |
|---|---|---|---|
| GB | 1 161 789 A | 8/1969 | |
| JP | 57-171272 | * 10/1982 | G01R 29/20 |
| JP | 63 055501 U | 4/1988 | |
| WO | 86/06497 A1 | 11/1986 | |

OTHER PUBLICATIONS

Notification Concerning Transmittal of International Preliminary Report on Patentability from PCT/US2008/072873 dated Feb. 25, 2010.

Serway, Physics for Scientists and Engineers with Modern Physics, Saunders College Publication, 1996, pp. 981-983.

International Search Report for PCT/US2008/072873 dated Jan. 30, 2009.

IEEE Standard C57.13-1993 "Standard Requirements for Instrument Transformers" 1994, *The Institute of Electrical and Electronics Engineers, Inc.*

* cited by examiner

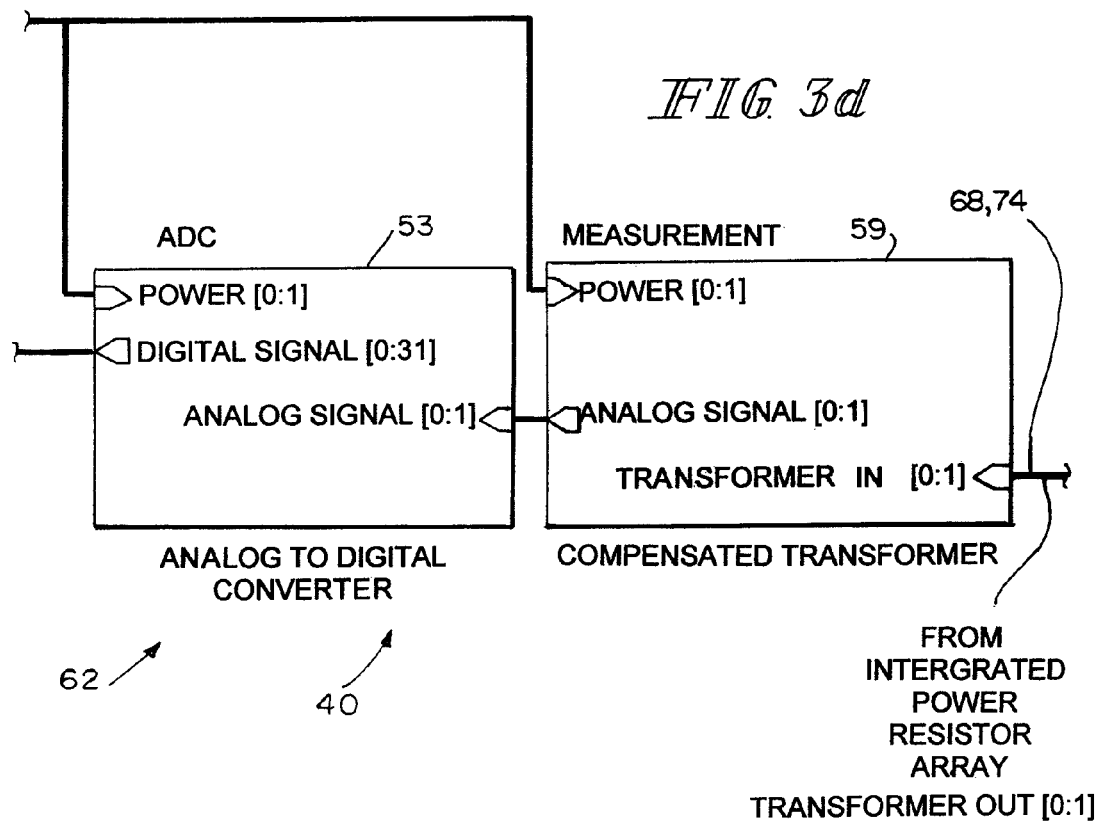
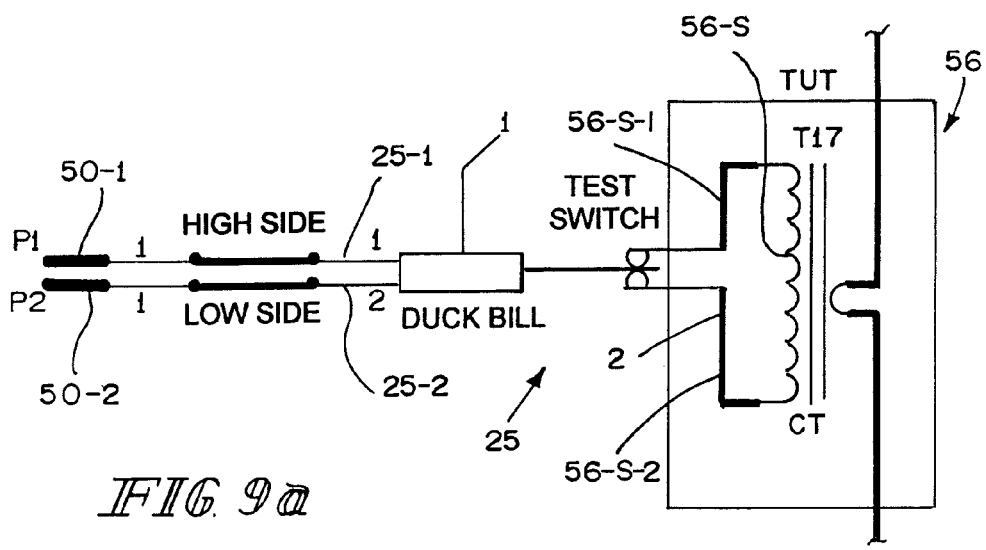

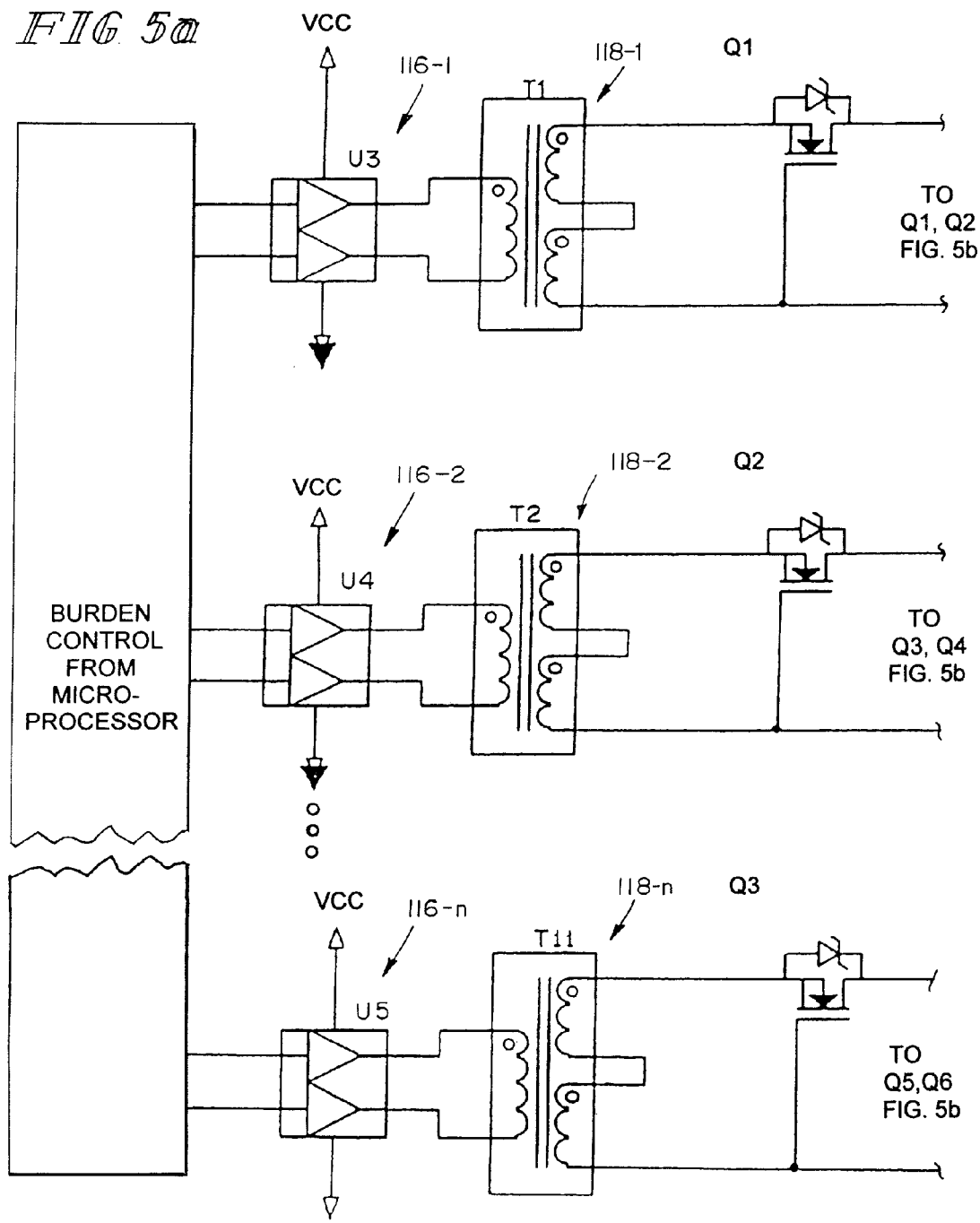

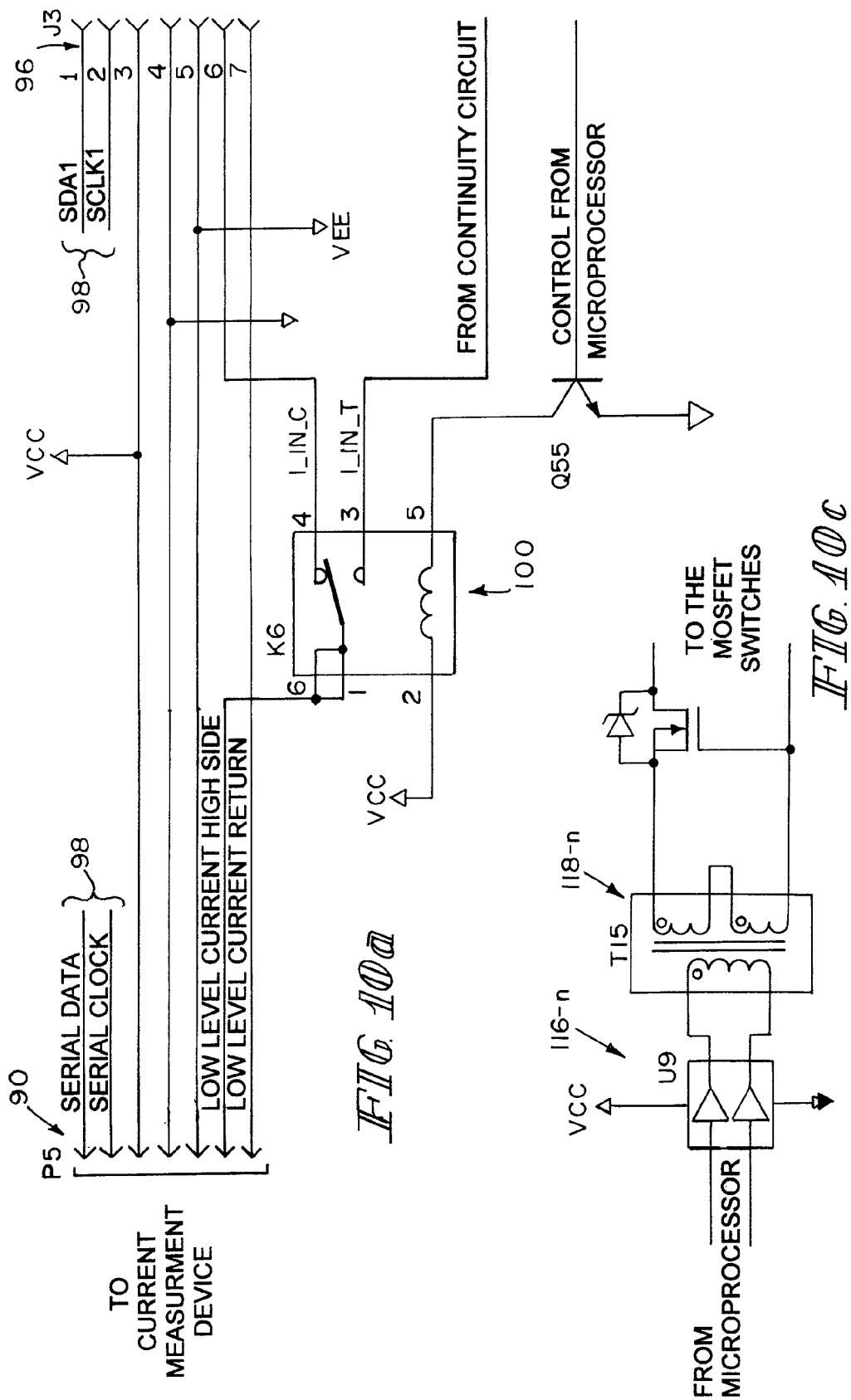

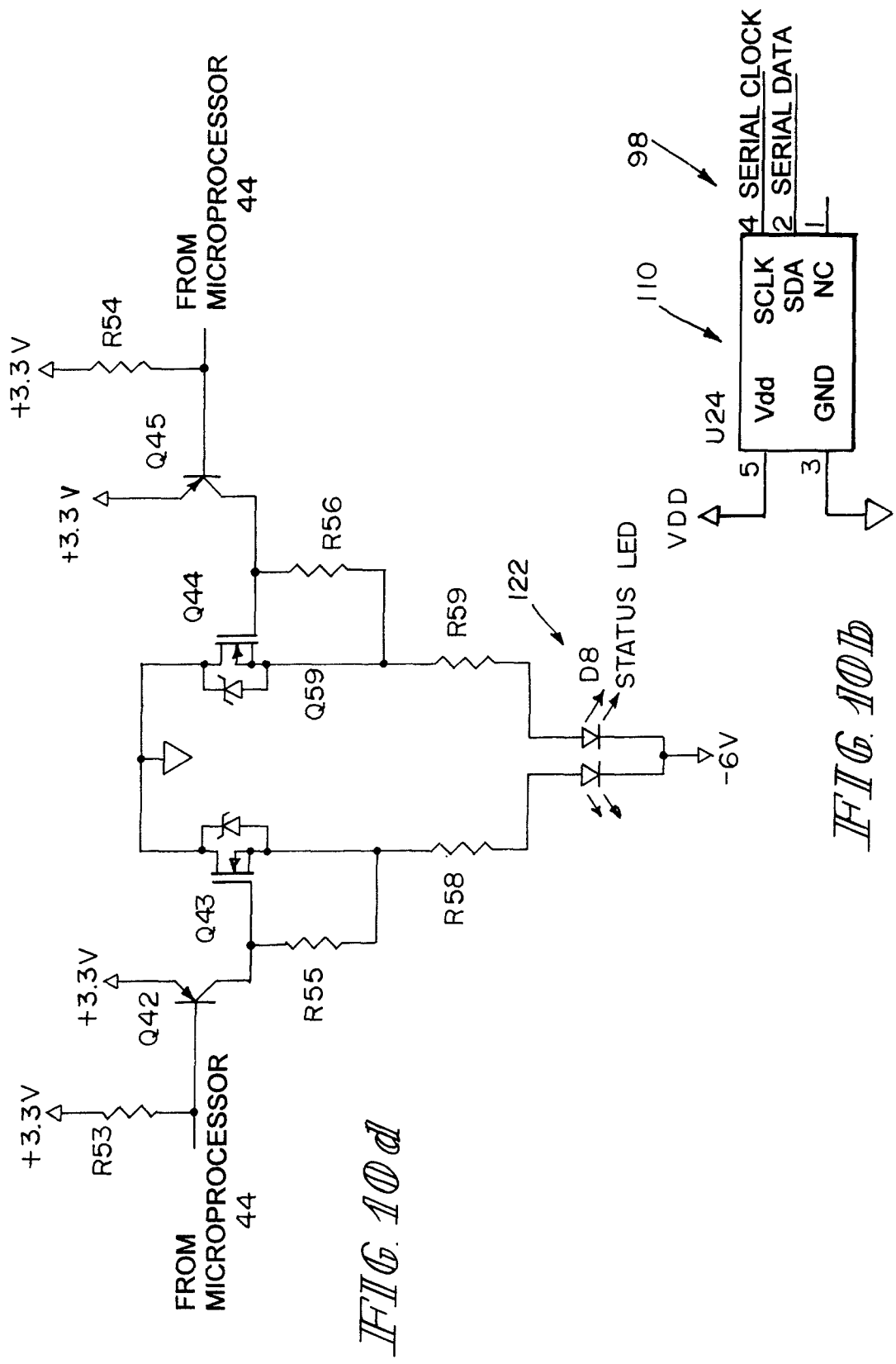

INSTRUMENT TRANSFORMER TEST EQUIPMENT AND METHOD

CROSS REFERENCE TO RELATED APPLICATIONS

This application is the U.S. national phase of PCT/US2008/072873 filed Aug. 12, 2008. PCT/US2008/072873 claims the benefit under 35 U. S. C. §119(e) of U.S. Ser. No. 60/956,322, filed Aug. 16, 2007. The entire disclosures of U.S. Ser. No. 60/956,322, and PCT/US2008/072873 are hereby incorporated herein by reference.

FIELD OF INVENTION

This invention relates to instrument transformer test equipment. It is disclosed in the context of equipment and methods for burden testing of instrument transformers, but is believed to have utility in other applications as well.

BACKGROUND OF THE INVENTION

The prior art includes U.S. Pat. Nos. 7,0303,602; 6,680,616; 6,160,697; Serway, *Physics for Scientists and Engineers*, Saunders College Pub. 1996; and IEEE Standard C57.13-1993 Standard Requirements for Instrument Transformers. The disclosures of these references are hereby incorporated herein by reference. The above listing is not intended to be a representation that a complete search of all relevant art has been made, or that no more pertinent art than that listed exists, or that the listed art is material to patentability. Nor should any such representation be inferred.

SUMMARY OF THE INVENTION

According to an aspect of the invention, a method for testing a transformer comprises operating a controller to generate a switching signal, supplying the switching signal to a solid state switch in circuit with a test load of known magnitude, switching the solid state switch to place the test load in circuit with the transformer, and measuring a signal through or across the transformer.

Illustratively, the method further includes analog-to-digital converting the measured signal.

Illustratively, the method further includes locking the phase of the switching signal to the phase of the measured signal.

Illustratively according to the method, supplying the switching signal to the solid state switch in circuit with the test load comprises supplying the switching signal to the solid state switch in parallel with the test load.

Illustratively according to the method, supplying the switching signal to the solid state switch in circuit with the test load comprises supplying the switching signal to the solid state switch in series with the test load.

Illustratively according to the method, supplying the switching signal to the solid state switch in circuit with the test load comprises supplying the switching signal to the solid state switch in series-parallel with the test load.

Illustratively, the method further includes monitoring zero crossings of the measured signal.

Illustratively, the method further includes operating the controller to generate the switching signal substantially at the zero crossings of the measured signal.

Illustratively, the method further includes analog-to-digital converting the measured signal.

Illustratively according to the method, supplying the switching signal to a solid state switch comprises supplying the switching signal to a field effect transistor.

According to another aspect of the invention, apparatus for testing a transformer comprises a controller for generating a switching signal, a test load of known magnitude, and a solid state switch in circuit with the test load. The solid state switch has a control port coupled to the controller for supplying the switching signal to the solid state switch to place the test load in circuit with the transformer. The apparatus further comprises a measurement device coupled to the test load for measuring a signal through or across the transformer.

Illustratively, the apparatus further includes an analog-to-digital converter coupled to the transformer and to the measurement device for analog-to-digital converting the measured signal.

Illustratively according to this aspect, the controller is coupled to the test load to lock the phase of the switching signal to the phase of the measured signal.

Illustratively according to this aspect, the solid state switch is coupled in series circuit with the test load.

Illustratively according to this aspect, the solid state switch is coupled in parallel circuit with the test load.

Illustratively, the apparatus further includes multiple solid state switches. The solid state switches are coupled in series-parallel circuit with the test load.

Illustratively according to this aspect, the controller is coupled to the test load to monitoring zero crossings of the measured signal.

Illustratively according to this aspect, the controller supplies the switching signal to the solid state switch substantially at the zero crossings of the measured signal.

Illustratively, the apparatus further includes an analog-to-digital converter coupled to the transformer and to the measurement device for analog-to-digital converting the measured signal.

Illustratively according to this aspect, the solid state switch comprises a field effect transistor.

According to another aspect of the invention, a method for testing a transformer comprises placing a series of test loads of different known magnitudes in circuit with the transformer from the lowest magnitude to the highest.

Illustratively, the method further includes placing the series of test loads of different known magnitudes in circuit with the transformer from the highest magnitude to the lowest.

According to another aspect of the invention, a method for testing a transformer comprises placing a series of test loads of different known magnitudes in circuit with the transformer from the highest magnitude to the lowest.

According to another aspect of the invention, apparatus for testing a transformer comprises a series of test loads of different known magnitudes ranging from a lowest magnitude to a highest magnitude. The apparatus includes multiple solid state switches coupled to the test loads of the series for placing the test loads of the series in circuit with the transformer and a controller for controlling the multiple solid state switches first to place the series of test loads in circuit with the transformer from the lowest magnitude to the highest.

Illustratively according to this aspect, the controller for controlling the multiple solid state switches first to place the series of test loads in circuit with the transformer from the lowest magnitude to the highest further controls the multiple solid state switches to then place the series of test loads in circuit with the transformer from the highest magnitude to the lowest.

According to another aspect of the invention, apparatus for testing a transformer comprises a series of test loads of different known magnitudes ranging from a lowest magnitude to a highest magnitude. The apparatus includes multiple solid state switches coupled to the test loads of the series for placing the test loads of the series in circuit with the transformer and a controller for controlling the multiple solid state switches first to place the series of test loads in circuit with the transformer from the highest magnitude to the lowest.

According to another aspect of the invention, a test load array comprises a plurality of power resistors. Each power resistor has a pair of terminals for selectively coupling to a device to be tested. The test load array further comprises a heat sink for accommodating the plurality of power resistors and a material for providing electrical insulation of the power resistors from the heat sink and thermal conductivity between the power resistors and the heat sink.

Illustratively, the apparatus further includes a fan for moving air across the heat sink. The fan mounted on the heat sink.

Illustratively, the apparatus further includes a temperature sensor mounted on the heat sink. The temperature sensor controls the fan.

Illustratively, the apparatus further includes a controller. The temperature sensor is coupled to the controller to provide a signal related to the temperature of the heat sink to the controller. The controller is coupled to the fan to control operation of the fan.

BRIEF DESCRIPTIONS OF THE DRAWINGS

The invention may best be understood by referring to the following detailed descriptions and accompanying drawings which illustrate the invention. In the drawings.

Figure 4:
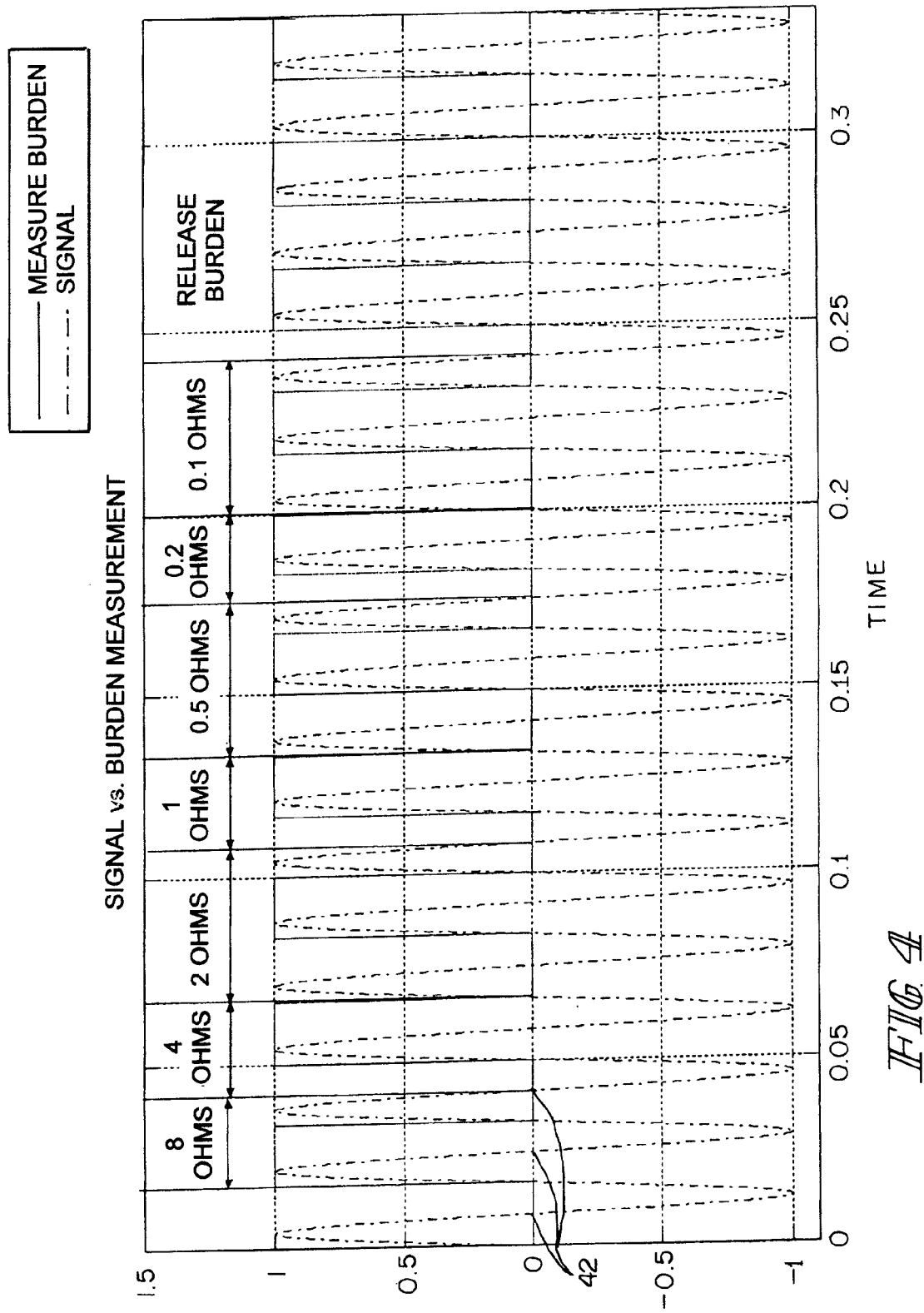
Figure 5B:
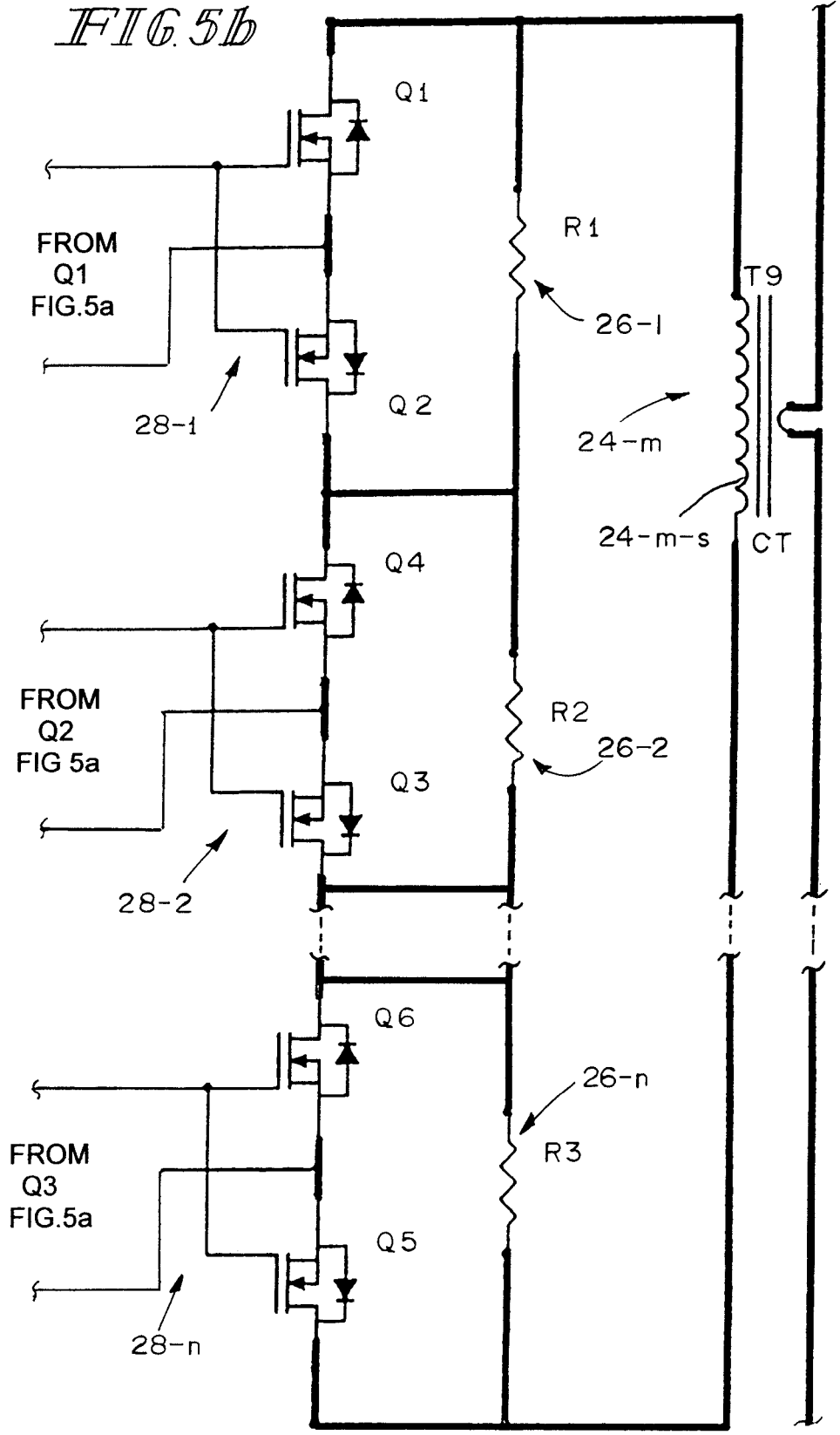
Figure 6A:
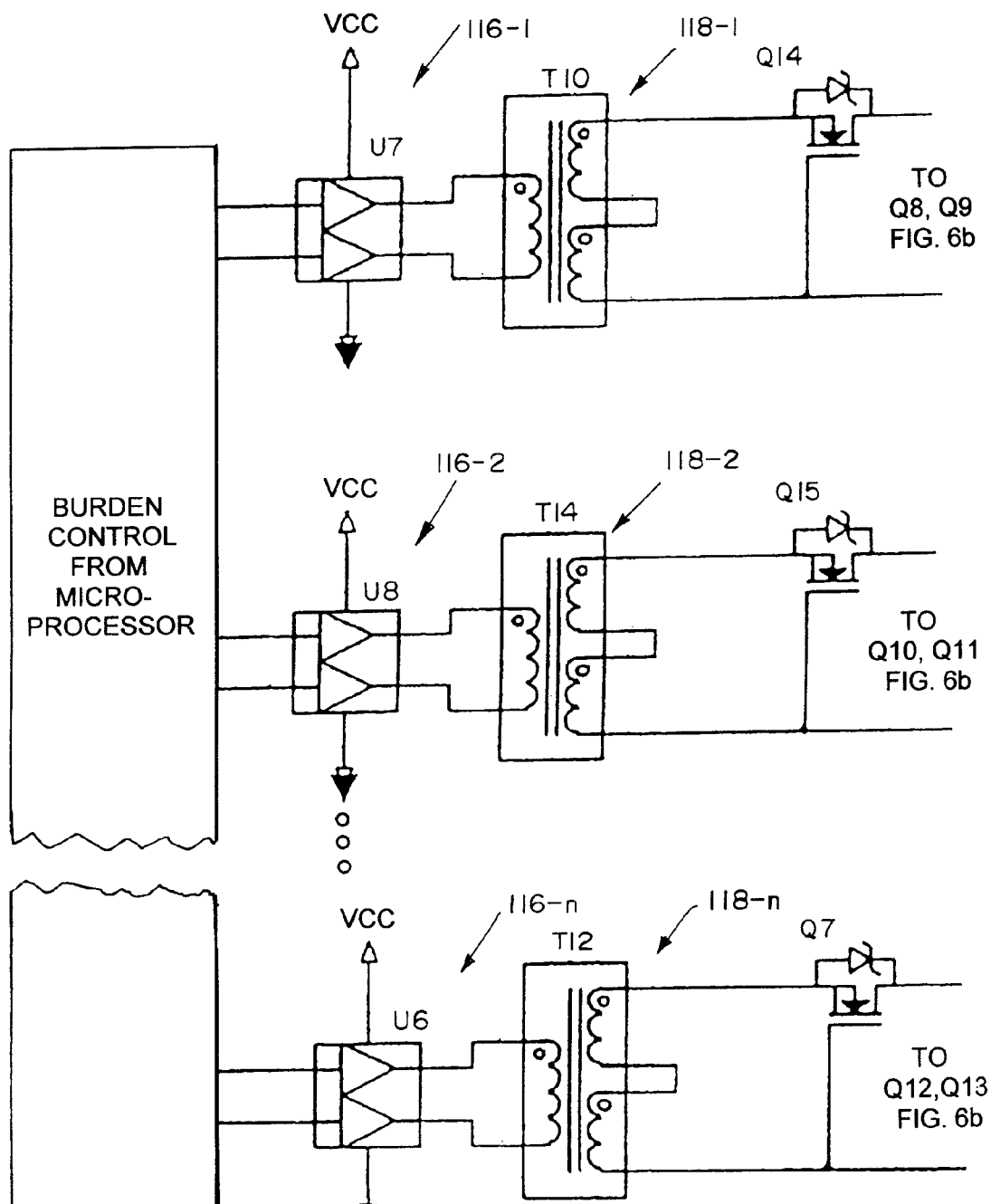
Figure 6B:
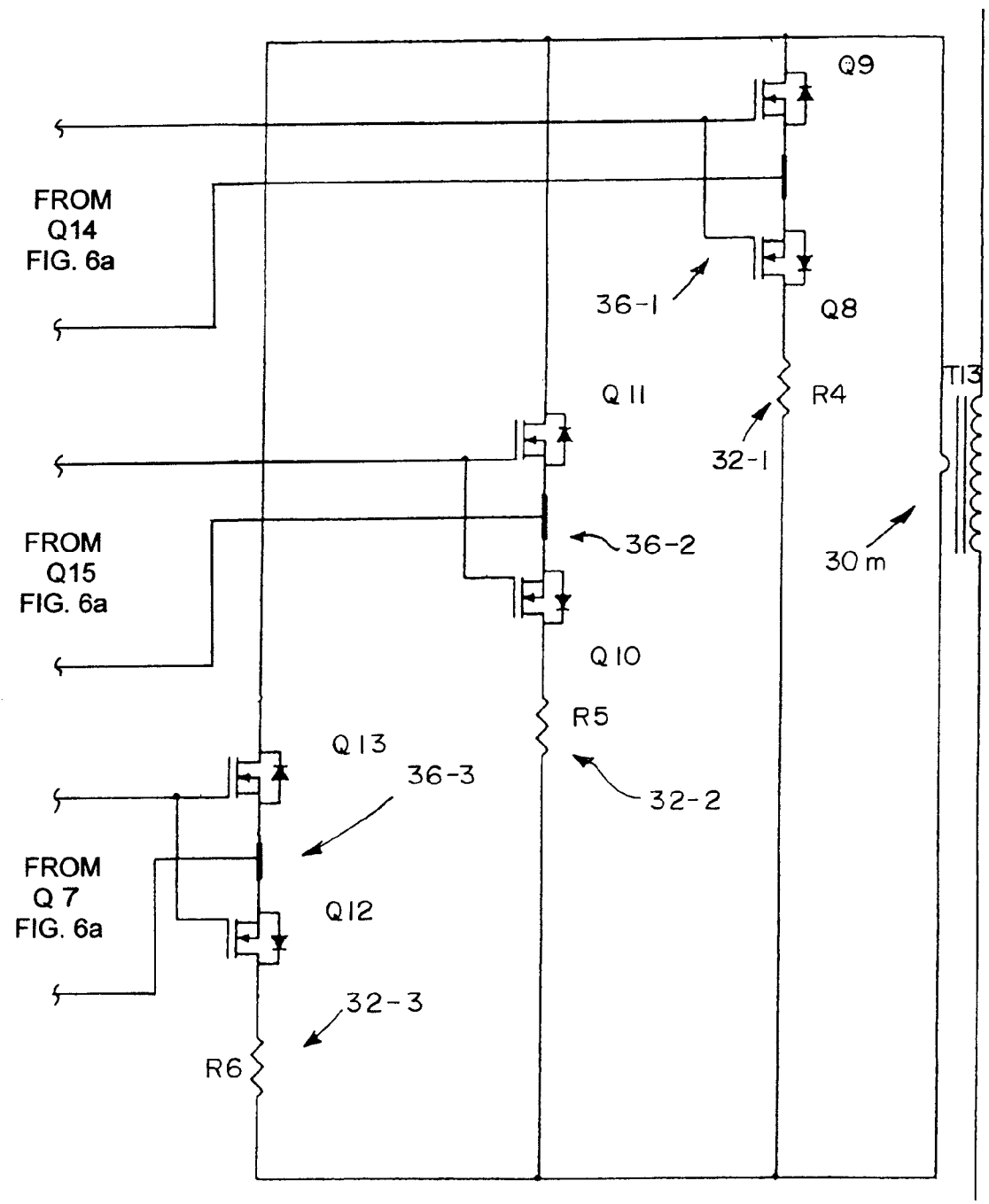
Figure 7:
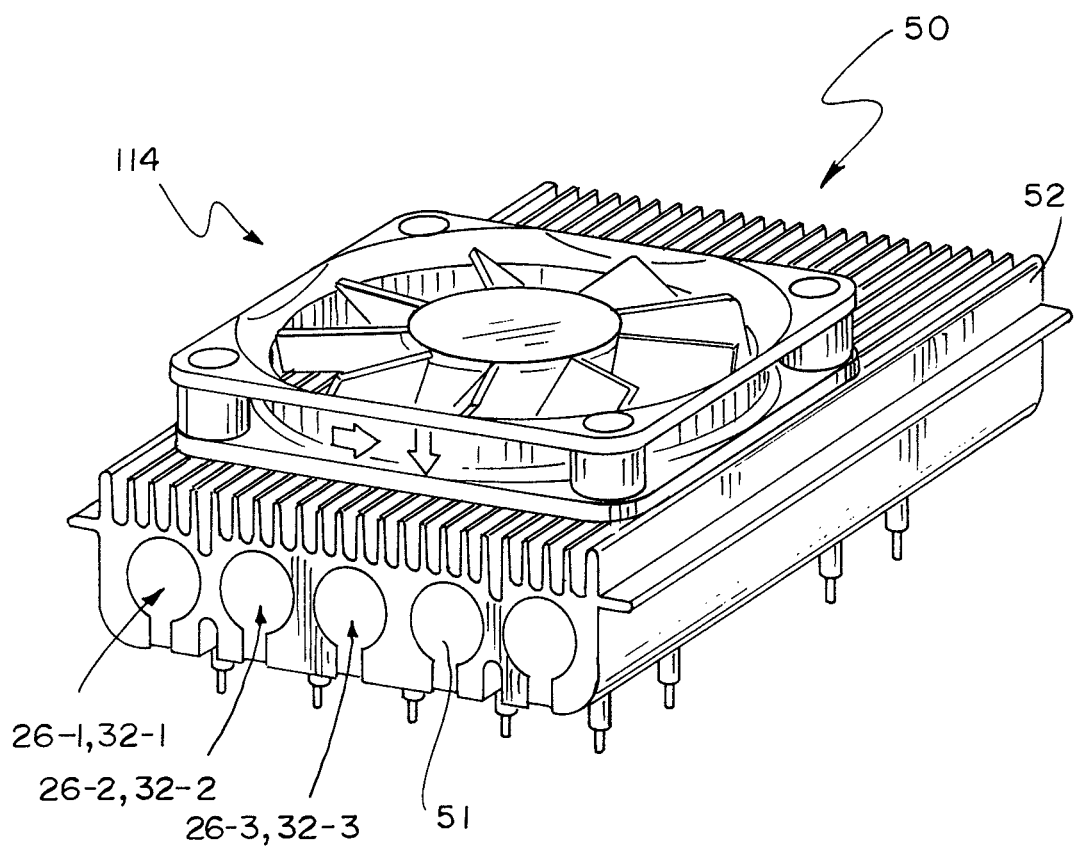
Figure 8:
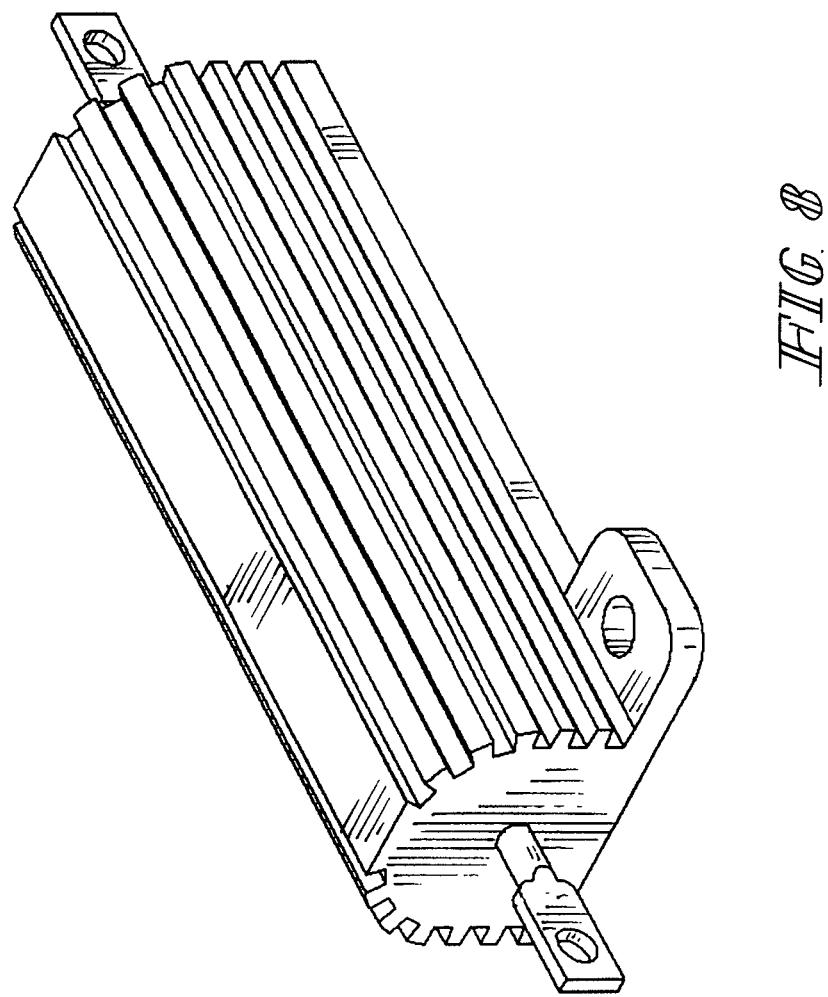

FIG. 3a-e illustrate diagrammatically a high accuracy, high speed measurement circuit;

FIG. 4 illustrates the burden switching cycle required for single cycle measurements that that reduce the likelihood of certain problems related to residual flux in the core of a transformer under test;

FIGS. 5a-b illustrate parallel switching elements with a series connected burden;

FIGS. 6a-b illustrate series switching elements with a parallel connected burden;

FIG. 7 illustrates a perspective view of a power resistor array integrated into a common heat sink;

FIG. 8 illustrates a perspective view of a prior art power resistor housed in a heat sink;

FIGS. 9a-d illustrate diagrammatically a transformer under test, a burden tester and associated protection and control circuitry;

FIG. 10a illustrates a schematic of the power, low current path, and communication interface and pass through;

FIG. 10b illustrates a schematic of drive circuit for a solid state switch;

FIG. 10c illustrates a schematic of a temperature sensor;

FIG. 10d illustrates a schematic of an LED drive circuit; and,

FIGS. 11a-d illustrate a flow diagram of a program for controlling the apparatus illustrated in FIGS. 9a-d and 10a-d.

DETAILED DESCRIPTIONS OF ILLUSTRATIVE EMBODIMENTS

In the descriptions that follow, several integrated circuits and other components are identified, with particular circuit types and sources. In many cases, component values, terminal names and pin numbers for these specifically identified circuits and components and sources are noted. This should not be interpreted to mean that the identified circuits and components are the only circuits and components available from the same, or any other, sources that will perform the described functions. Other circuits and components are typically available from the same, and other, sources which will perform the described functions. The terminal names and pin numbers of such other circuits and components may or may not be the same as those indicated for the specific circuits and components identified in this application.

Figure 1:
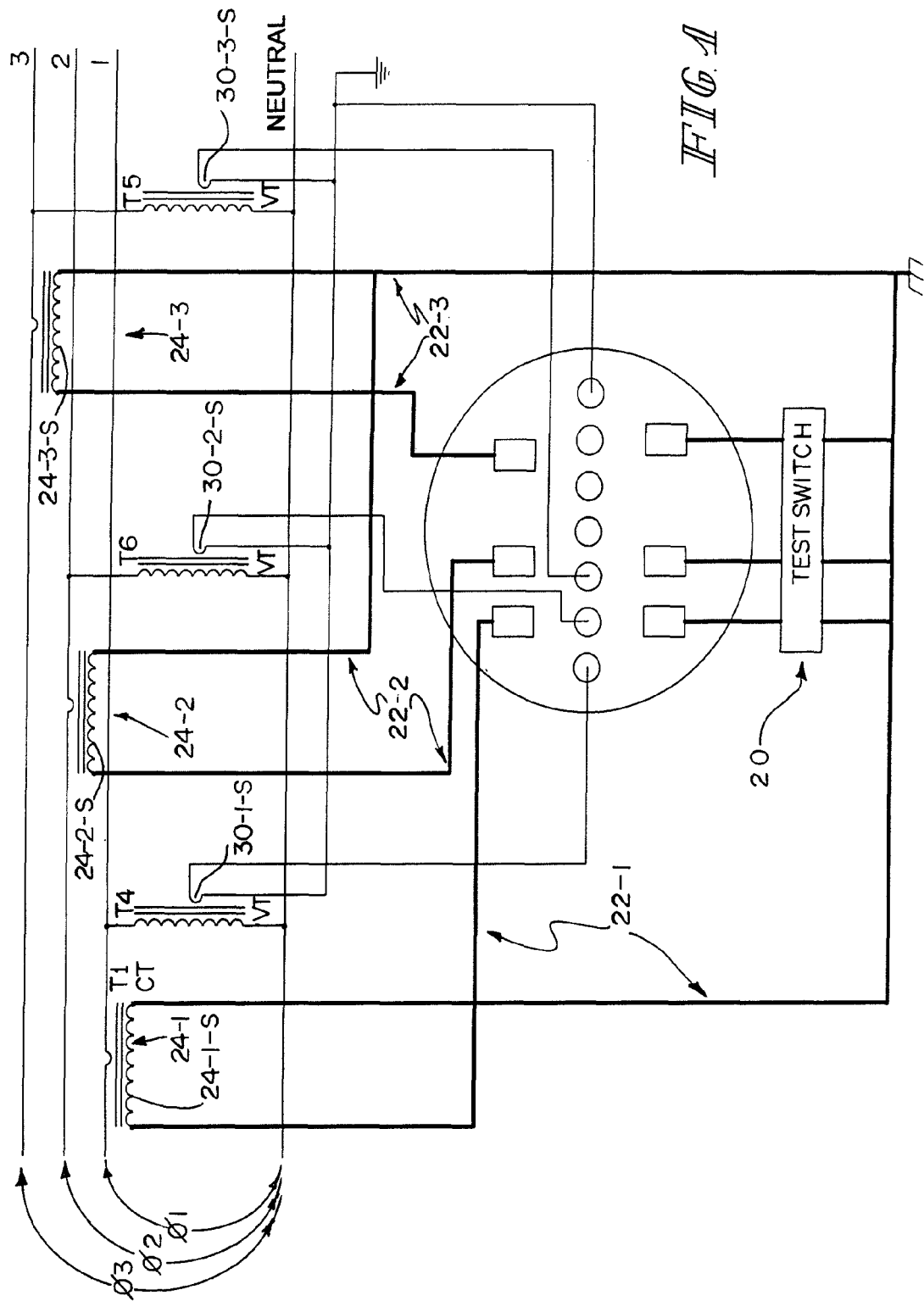
FIG. 1 illustrates diagrammatically an installation at a transformer substation.
Figure 2:
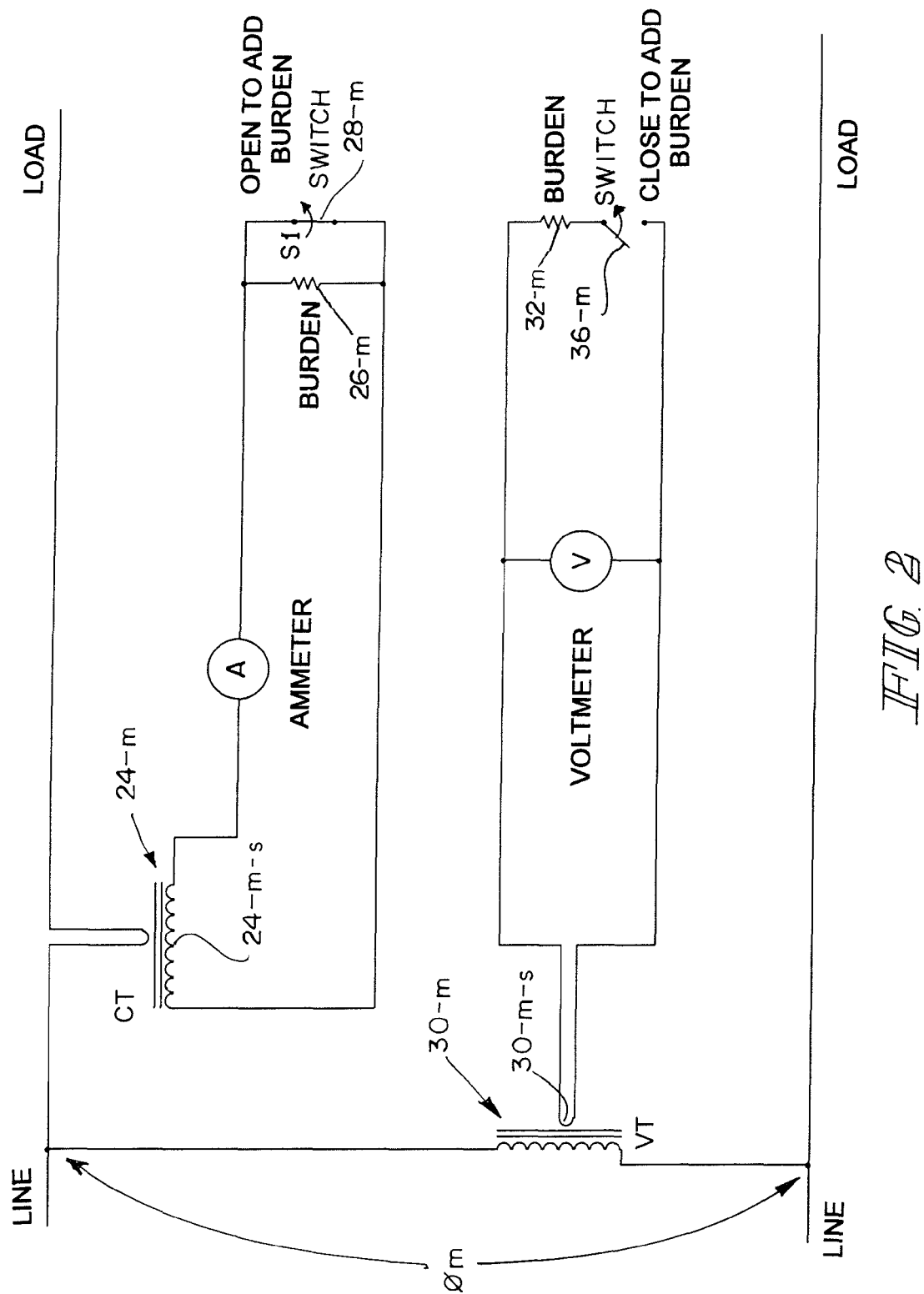
FIG. 2 illustrates diagrammatically circuits for performing current and voltage burden tests.

Power distribution from the generating plant to the load is accomplished by high-voltage, high-current transmission lines. The high voltages (for example, 345 KV or 765 KV) and currents (for example, in the thousands of amperes) necessary to transmit power efficiently from the plant are impractical for ordinary use at most loads. Generally, substations convert input voltage levels to output voltage levels (14.4 KV, 440 V, and so on) that are better suited for use at subscribers' loads. A substation may also interconnect multiple power generators' networks into a grid. The or each power generator typically monitors its contribution to the energy at the substation or interconnection for, for example, billing purposes. The voltages and currents at the substations are typically too large to be measured directly by an energy meter. Instead, an instrument transformer generally is used. A potential or voltage transformer (hereinafter sometimes VT) and a current transformer (hereinafter sometimes CT) are employed to generate precision ratio voltages and currents, and thus precision ratios to the energy passing through the substation at levels that are compatible with the energy meters installed at the substation; (typically 69 to 600 V AC and 0-20 A AC). FIG. 1 is a diagrammatic illustration of such an installation. For economic reasons, it is important to measure accurately the energy passing through a substation. One of the ways in which instrument transformers are rated is in accordance with so-called "Accuracy Class at Standard Burden" as defined in IEEE Standard C57.13-1993. Periodic testing may be required to verify that an instrument transformer maintains rated accuracy at rated burden while in service. Since the 1960s, various test equipment has been devised to test instrument transformers in service. FIG. 2 illustrates diagrammatically a basic setup for burden testing. Such a test sequence may proceed generally as follows: a voltage or current reading M1 is measured. The rated burden is inserted into the circuit (generally in parallel for voltage and generally in series for current) and a second measurement M2 is taken. The burden is then removed from the circuit. The two readings are then compared as shown in equation 1 to determine the accuracy of the transformer.

$$(M1-M2)/M1 \times 100\% \leq \text{accuracy Class} \times 100\% \qquad \text{eq. 1}$$

There are several problems associated with in-service testing of instrument transformers. First, burden testing by its nature assumes that the primary current is constant during the test interval. Small load shifts during a test yield inaccurate results. Further, internal heating of the burden may contribute to inaccuracies. As an example, an 8Ω load conducting 5 A rms needs to be able to dissipate 200 W. However, temperature coefficients are associated with all resistors. The longer current passes through the burden, the more the burden heats up. The more the burden heats up, the greater is its drift from its nominal resistance.

Additionally, in currently available burden testers, the operator cannot control the points in the AC cycle at which the burden is inserted and removed. Adding or removing a burden when the current is at or near its peak can result in transformer magnetization. Transformer magnetization can result in flux offset in the core of the transformer under test (hereinafter sometimes TUT). This remnant offset flux can reduce the range of the transformer and result in an inaccurate output signal.

Still further, the length of time that the burden needs to be in the circuit is a function of the settling time of the measurement device and how quickly the operator can record the measurement before removing the burden. Furthermore, the resistors have definite life spans which are affected by temperature cycling. This requires that the burden resistors have power rating capability to dissipate the heat generated during burden testing. Thus, burden resistors typically are relatively heavy, unwieldy devices. Many early burden testers were designed for "pulse" dissipation operation, and were subject to accidental overload by careless operators who left burdens in circuit for too long. While burning open a burden resistor used for PT testing only leads to inaccurate test results, burning open a burden resistor used for CT testing can damage the CT and/or the test equipment, and potentially harm the operator.

In order to compensate for variations in the primary current during a test interval, the operator may take multiple measurements and average the results in an effort to reduce the effect of a varying primary load. However, this compounds the problems associated with internal heating of the burden and the length of time that the burden needs to be in the circuit.

To shorten the time that the burden needs to be in the circuit, the operator may insert the burden just long enough to read the measurement device. This may shorten the time that the burden is in the circuit. However, this technique relies on, for example, the operator's memory and, as a result, is subject to error. This technique also risks that the operator may not allow sufficient settling time for the measurement device.

In an effort to minimize these sources of error and to improve safety, automated burden testers were created in the 1980's and 1990's. The burden control is moved to an onboard microprocessor that automatically regulated both the magnitude of the burden and the length of time the burden is in the circuit. Measurements before and after insertion of the burden into the circuit are automatically recorded and the percentage change is automatically calculated. The percentage change can then be compared with the accuracy class of the transformer under test. Additional features such as data collection and computer download capability also appear in many of these automated burden testers.

The 1980's-1990's generation of burden testers, although an improvement over the "manual" burden test kits, typically requires an array of costly, high current relays and a number of discrete power burden resistors mounted on a relatively massive heat sink. The length of time any particular burden is in circuit depends on the switching speeds of the associated relays (which can be greater than 10 msec) and the settling time of the measurement circuit. Also, the 1980's-1990's generation of transformer testers, using relays, does not address control of the points in the waveform at which the burden is inserted into, and removed from, the measurement circuit. This may result in a burden being added and/or removed in mid-cycle. Due to the propagation delay in the action of the relays and the possibilities of entering and leaving the circuit mid-cycle, two complete cycles ($\frac{1}{30}^{th}$ of a second, or 33.33 msec at 60 Hz) have to be assumed for error, establishing a minimum measurement interval to compensate for insertion variation. Practically speaking, the prior art contains examples that require a minimum of one full second to take one burden measurement. Additionally, a load change during that one second period may still not avoid inaccuracies in the measurement, and the TUT's core may experience significant remnant magnetization as a result of the test.

In a typical installation illustrated in FIG. 1, a test switch 20 is provided in the paths 22-1, 22-2, 22-3 of the three phases $\phi1$, $\phi2$, $\phi3$, respectively, of the current transformers 24-1, 24-2, 24-3, respectively, so that a test paddle or "duck bill" 25 (see FIG. 9d), such as, for example, a Tesco model 1077 make-before-break test plug, may be inserted into the respective current loops without breaking the respective current paths.

Current burdens 26 (see FIG. 2) are added in series with the transformer 24-m, $1 \leq m \leq 3$, secondaries 24-m-s by, for example, opening respective bypass switches 28-m that otherwise shunt the current. The resistance values of the current burdens 26 are dictated by IEEE Standard C57.13-1993, but values in the range of $0.2\Omega$ are typical. A current measurement device, in the illustrated embodiment an ammeter A, is inserted in series with the burden 26-m-switch 28-m parallel combination to measure the effect of inserting the burden 26-m in the secondary 24-m-s of the current transformer 24-m under test. A voltage transformer 30-m, 1 may be tested in a similar manner by, for example, placing a burden 32 in parallel with the secondary 30-m-s of the transformer 30-m and closing the respective series switch 36-m, FIG. 2. Again, the resistance values of the voltage burdens 32 are dictated by IEEE Standard C57.13-1993, but values in the range of $288\Omega$ are typical. A voltage measurement device, in the illustrated embodiment a voltmeter V, is inserted in parallel with the burden 32-m-switch 36-m series combination to measure the effect of inserting the burden 32-m in the secondary 30-m-s of the voltage transformer 30-m under test.

Referring now to FIGS. 3a-e, a high accuracy, high speed measurement circuit 40 is used to measure the voltage or current of a TUT 24, 30. The accuracy and speed of the circuit 40 are such that it is possible to lock it in phase with the zero crossings 42, FIG. 4, of the voltage or current waveform and perform an rms measurement in a single cycle. As previously noted, prior art high current relays may have on the order of 10 msec of lag time while engaging or disengaging, which distorts the measurement. An appropriate number of cycles must then be integrated in an effort to reduce this distortion. In this disclosure, the prior art's relays and switches have been replaced by high speed MOSFET switches 28, 36 which are capable of switching a burden 26, 32 in under 100 nsec. Under the control of a computer (hereinafter sometimes microprocessor or μP) 44, FIG. 3a, working in conjunction with a digital signal processor (hereinafter sometimes DSP) 46, FIG. 3b, insertion and removal of a burden 26, 32 can be synchronized with the zero crossings 42, FIG. 4, of the signal. A more accurate, more distortion-free measurement of the instrument transformer 24 or 30's response to the burden 26, 32 can be completed in as short a time as one cycle (16.66 msec at 60 Hz). μP illustratively is an NXP LPC2141 32 bit ARM7 processor. DSP 46 illustratively is a Texas Instruments type TMS320 DSP.

Figure 3A:
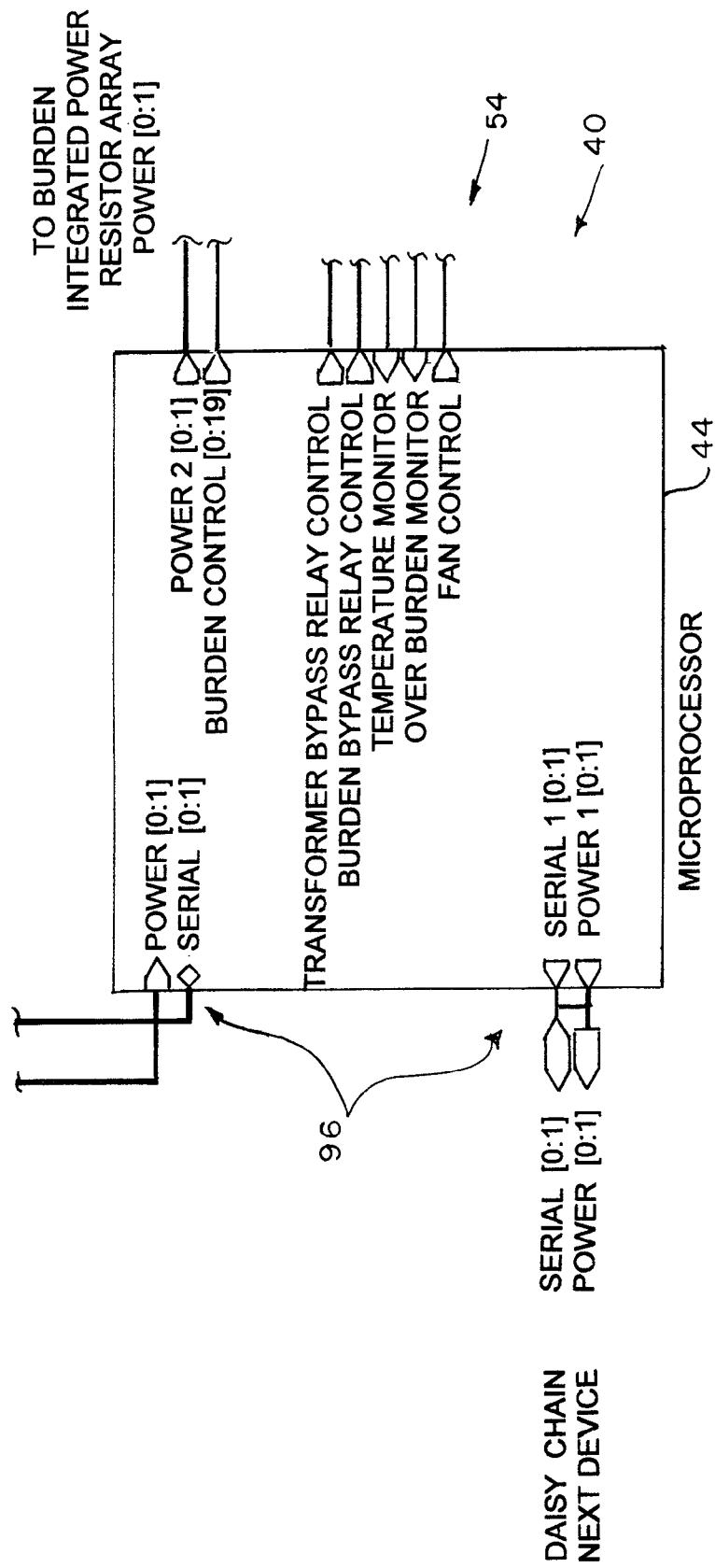
Figure 3E:
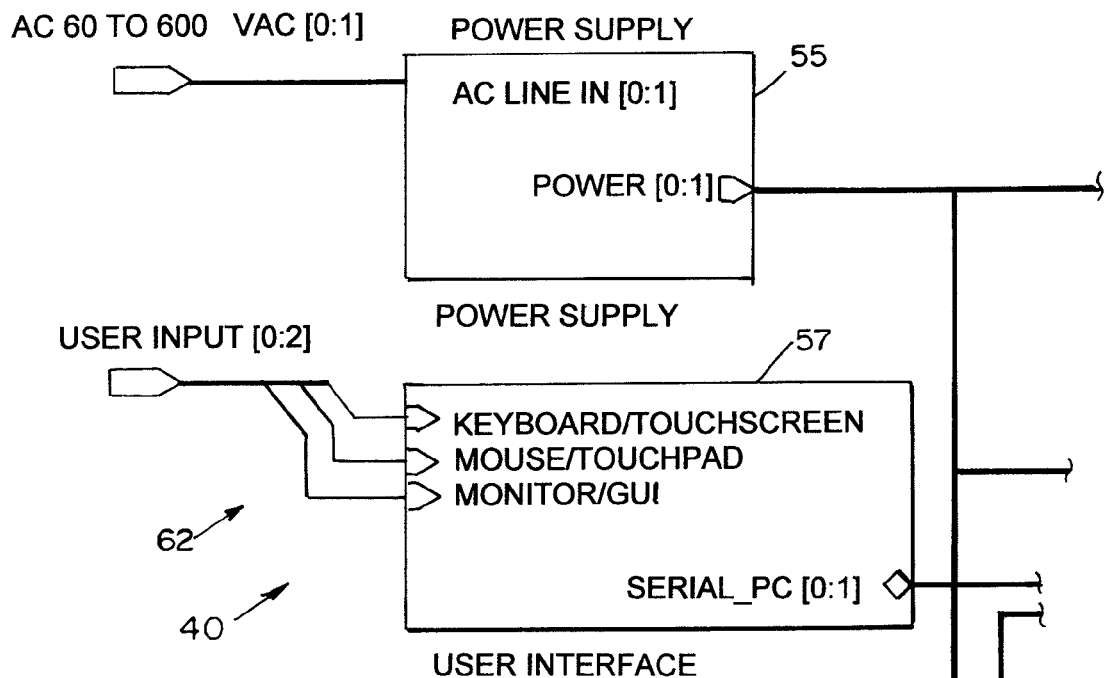
Figure 3B:
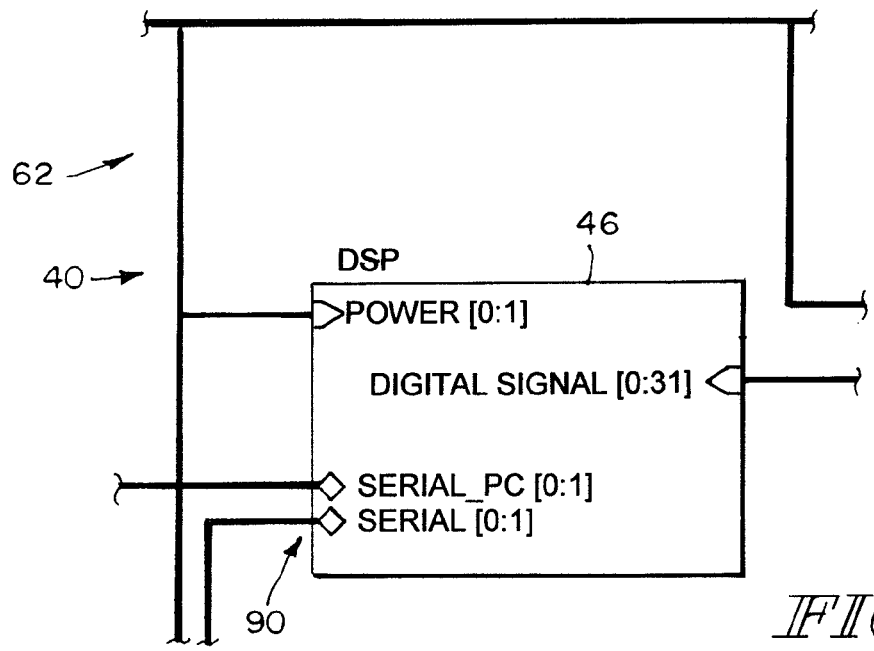
Figure 3C:
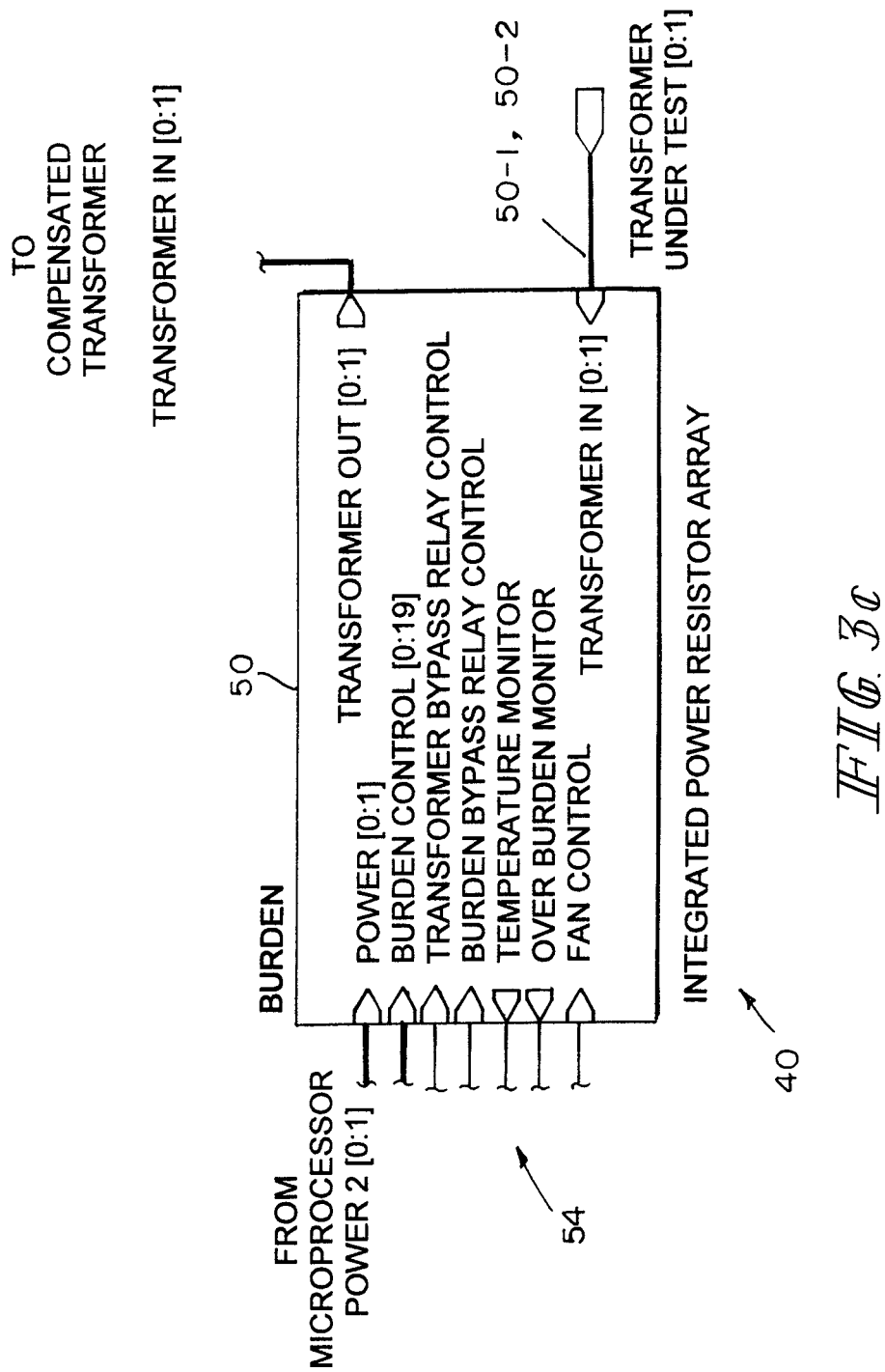

The measurement circuit includes the μP 44, the DSP 46, an integrated power resistor array (hereinafter sometimes IPRA) 50, FIG. 3c, providing the burden 26 or 32, an analog-to-digital converter (hereinafter sometimes ADC) 53 and compensated transformer 59, FIG. 3d, and a power supply 55 and user interface 57, FIG. 3e, all coupled in circuit as illustrated in FIGS. 3a-e with the transformer CT or VT under test. Illustratively, ADC 53 is of the general type described in U.S. Pat. No. 6,833,803, the disclosure of which is hereby incorporated herein by reference. Illustratively, compensated transformer 59 is of the general type described in U.S. Pat. No. 5,276,394, the disclosure of which is hereby incorporated herein by reference.

Power supply 55 (FIG. 3e) receives at an input port AC LINE IN[0:1] power from the substation or the like at substation level, for example, 60 to 600 VAC, and provides at an output port POWER[0:1] the necessary voltages and currents to power all of µP 44 (FIG. 3a), DSP 46 (FIG. 3b), IPRA 50 (FIG. 3c), compensated transformer 59 and ADC 53 (FIG. 3d) to all of which it is coupled either directly, or, in the case of IPRA 50, from the µP 44's POWER2[0:1] port to the IPRA 50's POWER[0:1] port.

The user interface 57, FIG. 3e, which may be a stand-alone PC connected or coupled wirelessly (e.g., by WiFi or Bluetooth protocol) or may be incorporated into the measurement device 62, includes user port USER INPUT[0:2], which may include KEYBOARD/TOUCHSCREEN, MOUSE/TOUCHPAD AND MONITOR/GUI I/Os, and port SERIAL_PC[0:1] which is coupled to DSP 46's SERIAL_PC[0:1] port. DSP 46's SERIAL [0:1] port is coupled to µP 44's SERIAL [0:1] port. µP 44's BURDEN CONTROL [0:19] port, TRANSFORMER BYPASS RELAY CONTROL port, BURDEN BYPASS RELAY CONTROL port, TEMPERATURE MONITOR port, OVERBURDEN MONITOR port and FAN CONTROL port are coupled, respectively, to IPRA 50's BURDEN CONTROL [0:19] port, TRANSFORMER BYPASS RELAY CONTROL port, BURDEN BYPASS RELAY CONTROL port, TEMPERATURE MONITOR port, OVERBURDEN MONITOR port and FAN CONTROL port. IPRA 50's TRANSFORMER IN[0:1] port is coupled to the transformer CT or VT under test. IPRA 50's TRANSFORMER OUT[0:1] port is coupled to the measurement compensated transformer 59's TRANSFORMER IN[0:1] port. The measurement compensated transformer 59's ANALOG SIGNAL [0:1] port is coupled to the ADC 53's ANALOG SIGNAL [0:1] port.

Referring to FIGS. 5a-b and 6a-b, the MOSFET switches 28, 36 can be placed in parallel with the burden elements 26, 32 (FIGS. 5a-b, particularly FIG. 5b), in series with the burden elements 26, 32 (FIGS. 6a-b, particularly FIG. 6b) or in any combination of series and parallel required to achieve the desired composite burden 26, 32 value(s). The number n of stages of switching that is desirable depends upon the desired range and increments of burdens to be added to the test loop. In an example, n might equal 10, with one resistor 26n of 0.2Ω, one of ⅓Ω, seven resistors of 1Ω resistance each, and one of 2Ω resistance. This permits a range of resistance values, including desired series combinations of the various resistor 26-n values to be inserted into the current loop of the secondary of the current transformer under test. The presence or absence of any resistor 26-n in the current loop is determined by the status of its respective switch 28-n. In a similar manner, a range of resistance values 32-n including desired parallel combinations of the various resistance values 32-n can be inserted into the voltage loop of the secondary of the voltage transformer under test. Switches 26-n each illustratively comprise two International Rectifier IRF6618 FETs. Higher voltage FETs are required for switches 36-n. Typical turns ratios for current transformers 24-m are 400:5, providing a 5 A secondary current for a 400 A primary current, 200:5, providing a 5 A secondary current for a 200 A primary current, 100:5, providing a 5 A secondary current for a 100 A primary current, and so on. In an illustrative circuit constructed in accordance with FIGS. 5a-b, ten burden resistors 26-1, 26-2, ... 26-10 having values of 0.2Ω, ⅓Ω, 1Ω, 1Ω, 1Ω, 1Ω, 1Ω, 1Ω, 1Ω, and 2Ω. These values permit a number of desirable current burdens to be put in circuit with the secondary 24-m-s of current transformer 24-m.

With the availability of single cycle measurements and flexible high speed switching, a test cycle may, for example, proceed as illustrated in FIG. 4, with the signal being applied sequentially to a series of burdens 26, 32 incrementing from the highest value to the lowest value. An illustrative test cycle might then continue from the lowest value back to the highest. Such a test cycle can measure the response of an instrument transformer 24, 30 at, for example, seven burden 26-n, 32-n values in less than 0.5 second at 60 Hz. The length of such a test cycle may be calculated from:

$$\text{Time}=(N\text{burdens}\times\text{Cycles/Burden})/\text{Freq} \qquad \text{eq. 2}$$

where Nburdens is the number of burdens 26-n or 32-n to be switched through, Cycles/Burden is the number of cycles during which each burden is in circuit during each step of the test, Freq is the source frequency (60 Hz in the illustrated example), and Time is the length of the measurement cycle.

In addition, such a test cycle can effectively demagnetize a core that might otherwise be operating with a residual flux by subjecting it to progressively lower induced magnetic field, effectively ramping down through the hysteresis curve.

The energy that must be dissipated by the burden 26-n, 32-n is directly proportional to the applied power and the time the burden 26-n, 32-n is in circuit. As examples, consider the amounts of heat that must be dissipated by an 8 ohm burden 26, 32 with an applied 20 A rms signal for 0.8 seconds and for 16.66 msec.

$$8\Omega\times(20\text{ A})^2\times0.8\text{ sec}=2560\text{ joules} \qquad \text{eq. 3}$$

$$8\Omega\times(20\text{ A})^2\times0.01666\text{ sec}=53\text{ joules} \qquad \text{eq. 4}$$

The temperature change, $\Delta T$, is directly proportional to the thermal energy, Q.

$$\Delta T=Q/mc \qquad \text{eq. 5}$$

where m is the mass of the material being heated and c is the specific heat of the material. Thus, for two devices of equal mass m and specific heat c, the described method of burden testing results in a temperature change about one fiftieth (53 joules/2560 joules=0.0207) that experienced with prior art methods. A one and a half orders of magnitude drop in test time equates to a one and a half orders of magnitude drop in energy that needs to be dissipated.

Referring now to FIGS. 7 and 8, a feature of prior art discrete power resistors was used to advantage. Typically, only one or a small subset of the total number of available burden resistors 26-n, 32-n are used at a time. According to this aspect, then, the heat sink(s) housing all of the resistors 26-n, 32-n can be used to help dissipate the heat when only one or two resistors may be used during a test, effectively increasing m in equation 5 above. The multiple burden resistors 26-n, 32-n are mounted together in IPRA 50. Discrete high power handling capacity resistors 26-1, 26-2, ... 26-n, 32-1, 32-2, ... 32-n are potted into a common heat sink 52 constructed from a material, such as, for example, aluminum, copper or the like, having a high heat capacity, using a highly thermally conductive, yet electrically insulating potting material 51, thereby forming an aggregate or composite burden element. The illustrative resistors 26-1, 26-2, ... 26-n, 32-1, 32-2, ... 32-n are ten in number (n=10), and are generally circular in cross section transverse to their longitudinal extents. An illustrative potting material 51 is Aremco Products Inc, CERAMACAST 675 mixed with green silicon carbide at a ratio of 5:3. Generally circular cross section channels are provided in heat sink 52 for slidably receiving two resistors 26-1, 26-2, . . . 26-n, 32-1, 32-2, . . . 32-n each. The resistors 26-1, 26-2, . . . 26-n, 32-1, 32-2, . . . 32-n are coating with the potting material 51 before or as they are inserted into the channels, and additional potting material is added to fill the channels after the resistors are inserted into the channels. The potting material is then permitted to harden, fixing the resistors 26-1, 26-2, . . . 26-n, 32-1, 32-2, . . . 32-n in thermal contact with the heat sink 52 while electrically insulating them from the heat sink 52. When compared to, for example, ten discrete parts such as, for example, Vishay RH-50 resistors, FIG. 8, the IPRA 50 has 30% less weight, and any switched series and/or parallel combination of values is capable of dissipating 105 W continuously at 25° C. A single unmounted Vishay RH-50 resistor, FIG. 8, is capable of dissipating 12 W when operated in free air.

Figure 9B:
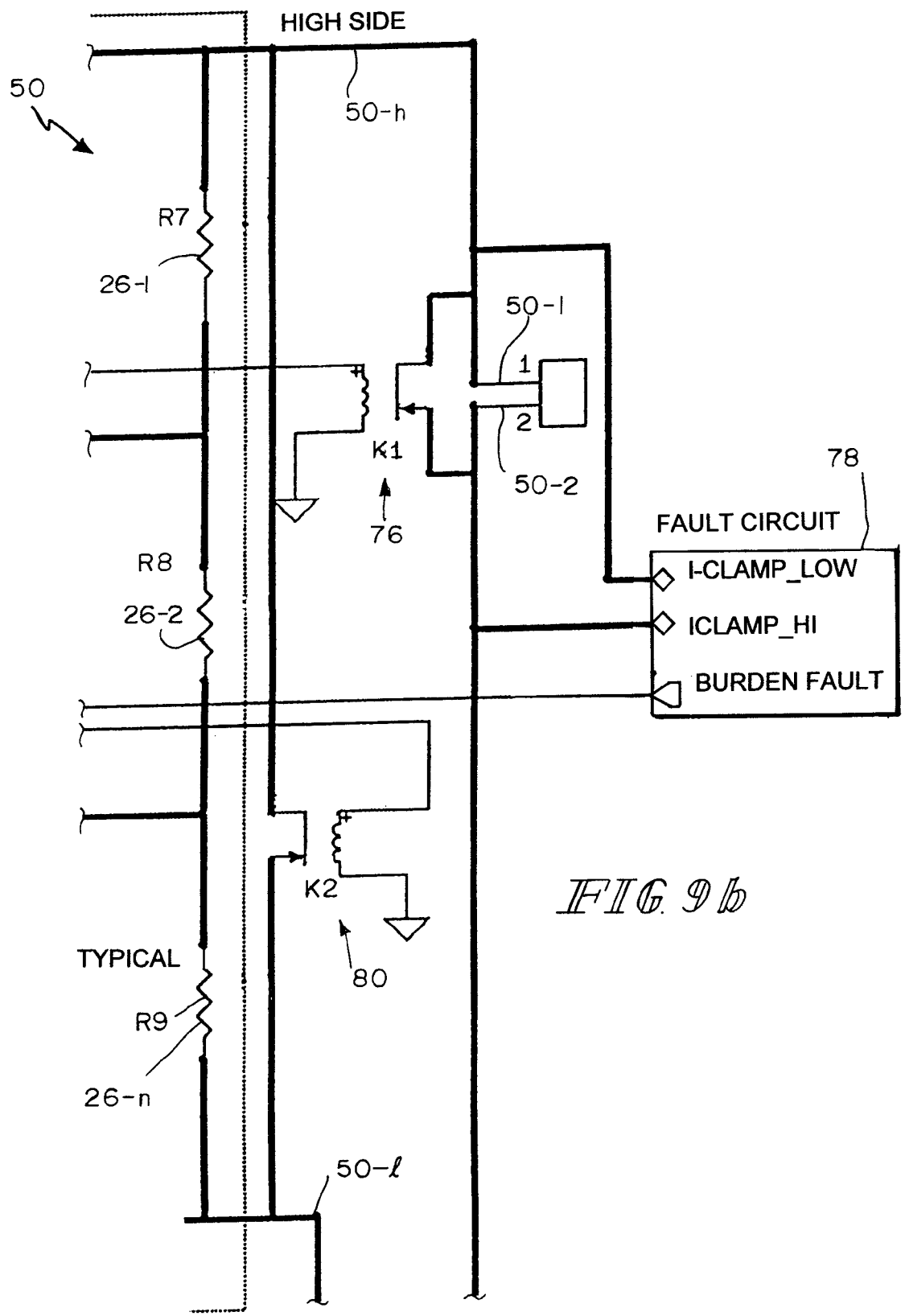

Referring now to FIGS. 9*a-d*, a burden tester 54 (FIGS. 3*a* and 3*c*) configured for testing an instrument current transformer 56, FIG. 9*a*, comprises a test paddle or duck bill 25 having leads 25-1, 25-2 for coupling to high and low side leads 56-s-1 and 56-s-2, respectively, of the secondary 56-s of transformer 56. The high side 25-1 of the duck bill 25 is coupled to a high current connector pin 50-1, FIGS. 9*a-b*, that is coupled to the high side of an IPRA 50 in the burden tester 54. The low side 25-2 of the duck bill 25 is coupled via a high current connector pin 50-2 to one terminal 70-p-1 of the primary winding 70-p of a continuity transformer 70 in the burden tester 54. First 60-1 and second 60-2 high current paths couple the burden tester 54 to a high accuracy DSP 46-controlled current measurement device 62 (FIGS. 3*b, d* and *e*). The first and second high current paths 60-1, 60-2, respectively, are coupled together by high-current, low-bias clamping diodes 64-1, 64-2, FIG. 9*c*, to provide a high current, low burden path if the current measurement device 62 is not in circuit. Diodes 64-1, 64-2 illustratively are ST Microelectronics STPS30H60CG diodes. The first high current path 60-1 couples the low side of the IPRA 50 to a high current test lead 66 terminated with a high current plug 68.

The second high current path 60-2 couples a low side terminal 70-p-2 of a primary 70-p of continuity transformer 70 to a high current test lead 72 terminated with a high current plug 74. The n resistors 26-1, 26-2, . . . 26-n, FIGS. 9*b* and *d*, in the IPRA 50 are coupled in series. A relay 76, when activated, shunts the secondary 56-s of the current transformer 56 by shunting high current connector pin 50-1, FIG. 9*a*, to high current connector pin 50-2 when relay 76 is closed. An illustrative relay 76 is the Tyco RTD14012F relay.

A high current fault circuit 78 is placed across high current connector pin 50-1 and high current connector pin 50-2. Circuit 78 monitors the voltage across secondary 56-s of the current transformer 56 under test and clamps the secondary 56-s in the event of an over-burden condition, such as, for example, when the voltage across the secondary 56-s gets above 60 volts peak. Circuit 78 also shorts the secondary until relay 76 closes. A typical relay 76 has a 20 msec switching time.

A second relay 80 shunts the IPRA 50 high side 50-h to its low side 50-l when closed. An illustrative relay 80 is the Tyco RTD14012F relay.

Figure 9C:
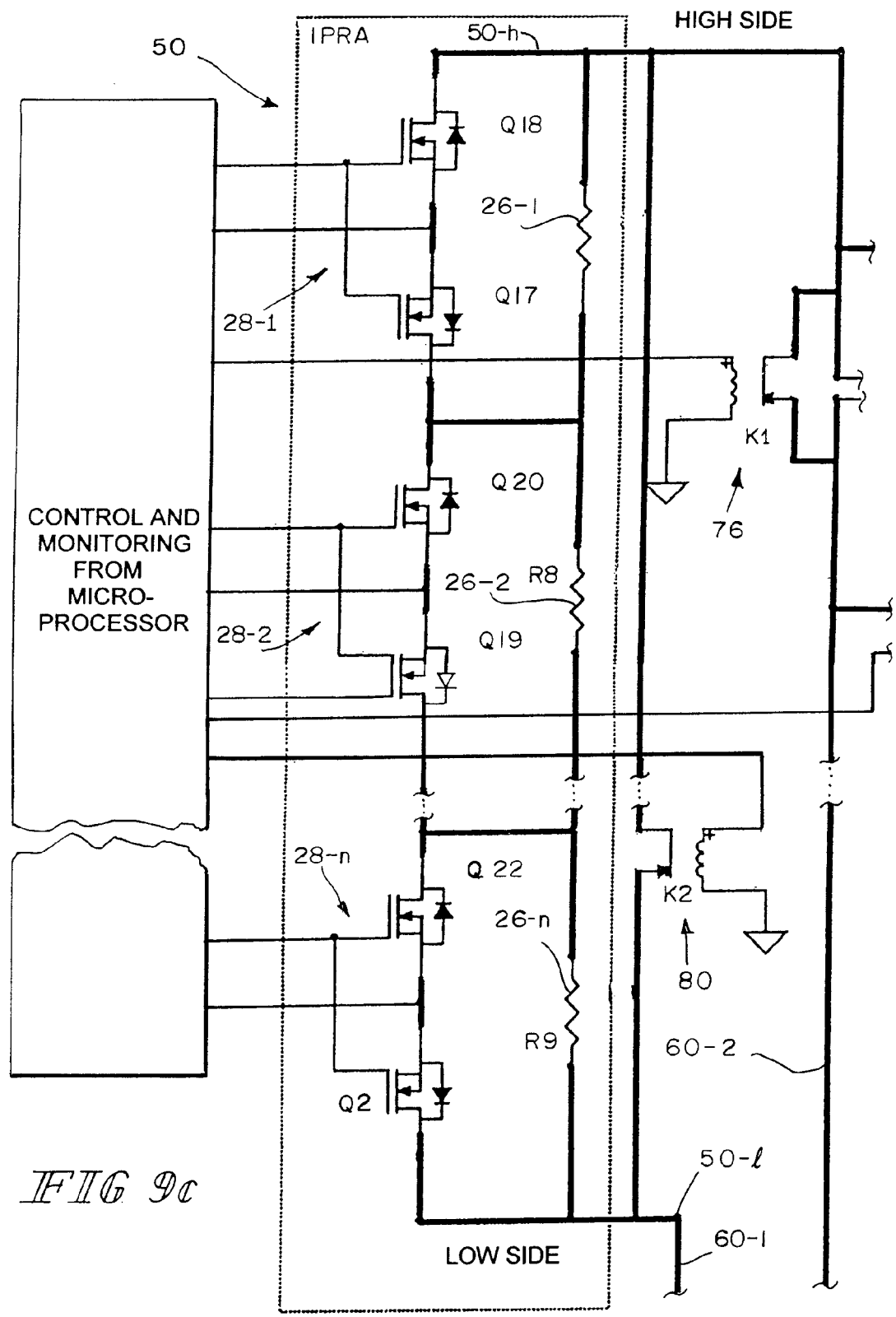
Figure 9D:
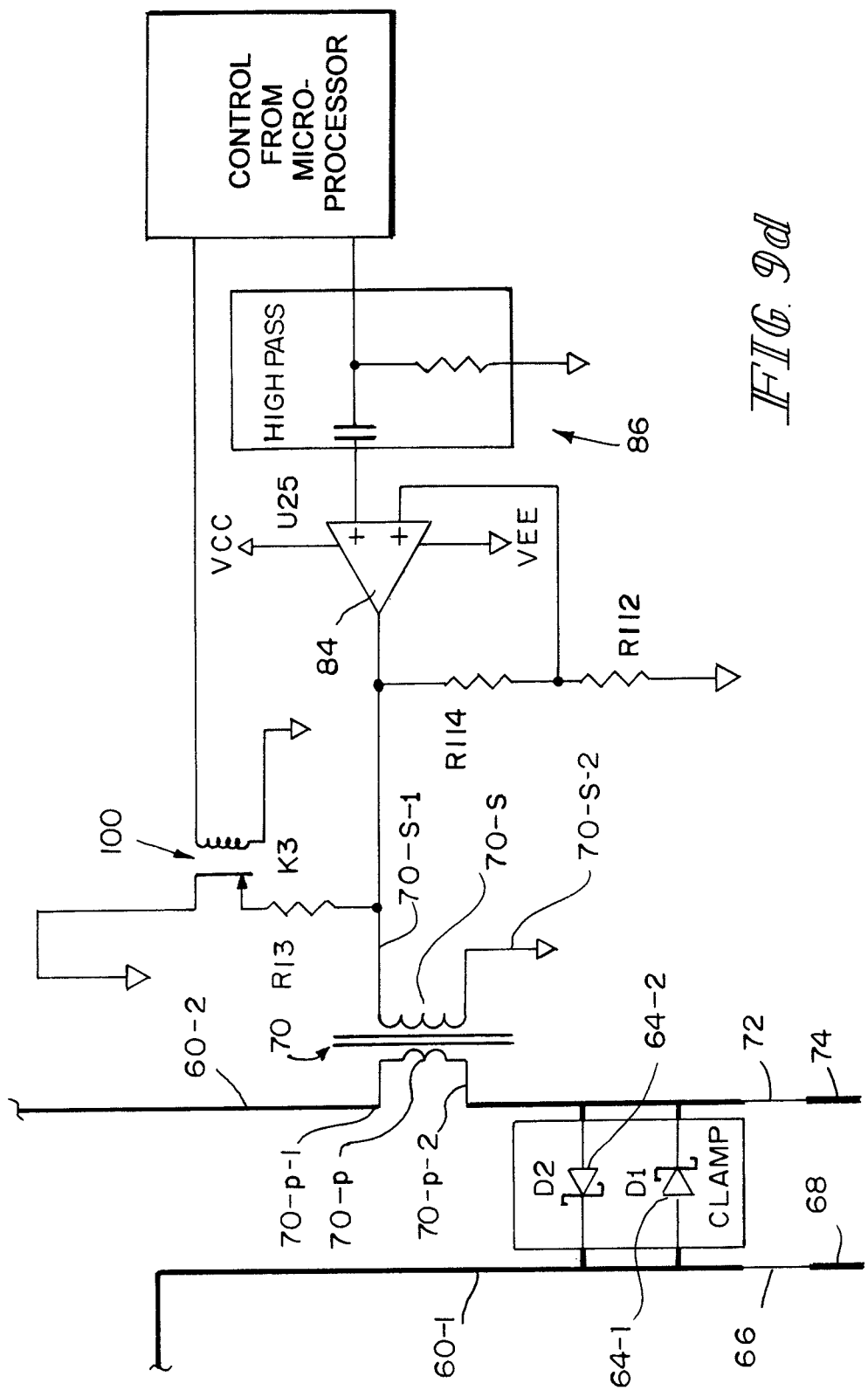

A high-side terminal 70-s-1, FIG. 9*c*, of the secondary 70-s of the continuity transformer 70 is coupled to an output terminal of an amplifier 84 having an inverting (−) input terminal and a non-inverting (+) input terminal. A low-side terminal 70-s-2 of the continuity transformer 70 is coupled to ground. The output terminal of the amplifier 84 is coupled through a 1 KΩ resistor to the − input terminal of amplifier 84. The − input terminal of amplifier 84 is further coupled through a 1 KΩ resistor to ground. The microprocessor 44 is coupled by a high pass filter 86 including a resistor having a resistance of, illustratively, 1 KΩ, and a capacitor having a capacitance of, illustratively, 10 µF, to the + input terminal of the amplifier 84. A signal may be generated by the microprocessor 44 and coupled to the high current path 60-1, 60-2 and measured by the current measurement device 62 to assure that a good path exists before applying a burden 26-1, 26-2, . . . 26-n to the current transformer 56 secondary 56-s. An illustrative continuity transformer 70 has a turns ratio of 125:2. The high side terminal 70-s-1 of secondary 70-s is also coupled through a low-value load resistor, illustratively, a 5 SI resistor, and a relay 100 to ground. Relay 100 illustratively is an Omron G5V relay. The purpose of relay 100 is to shunt the secondary 70-s when amplifier 84 is not injecting a signal. Otherwise, an impedance will be reflected back into the load of the secondary 56-s of the current transformer 56. Illustratively, amplifier 84 is a Burr-Brown (now Texas Instruments) type OPA227, $V_{CC}$ is 6V and $V_{EE}$ is −6V.

A MOSFET switch 28-1, 28-2, . . . 28-n couples the high side of each of resistors 26-1, 26-2, . . . 26-n, respectively, in the IPRA 50 to the respective resistor's low side. Each resistor 26-1, 26-2, . . . 26-n thus may be individually put in or taken out of circuit by turning its respective MOSFET switch 28-1, 28-2, . . . 28-n off or on.

Turning now to FIG. 10*a*, a low power plug 90 is provided to obtain auxiliary power, for serial communication and interfacing between the burden tester 54, FIGS. 3*a* and *c*, and the measurement device 62, FIGS. 3*b, d* and *e*. A low power jack 96 is provided to "daisy chain" additional devices to auxiliary power, to the serial communication lines 98, and for interfacing the low level current measurement circuit 62, FIGS. 3*b, d* and *e*. Relay 100, FIGS. 9*d* and 10*a*, permits selection between coupling the local continuity circuit, FIG. 9*d*, or a daisy chained device coupled to jack 96 to the current measurement circuit 62, FIGS. 3*b, d* and *e*. Relay 100 is driven from µP 44 through a bipolar transistor, illustratively a type 2N2222.

A clamp-on current probe, such as, for example, an AEMC model JM845A clamp-on current probe, may be attached to the pass-through connector 96 so that the primary current at the installation may be compared to the secondary current being measured directly on the high current path 60-1, 60-2.

Microprocessor 44 controls the relays 76, 80, 100 and MOSFET switches 28-1, 28-2, . . . 28-n or 36-1, 36-2, . . . 36-n, monitors a temperature sensor 110, FIG. 10*b*, affixed to the IPRA 50, monitors the overburden trip circuit 78, sources the voltage at the output port of amplifier 84 for the continuity test, modulates the fan 114, FIG. 7, associated with IPRA 50, and communicates with the DSP 46 over the serial communication lines 98. The temperature sensor 110 is coupled to the microprocessor 44 via two-wire serial line 98. Temperature sensor 110 illustratively is a NXP SA56004 with $V_{DD}$ of 3.3 V.

Each MOSFET switch 28-n, 36-n is driven from the microprocessor 44 through a buffer 116-n, driving a pulse transformer 118-n. See FIGS. 5*a*, 6*a* and 10*c*. An illustrative buffer 116-n is the Texas Instruments UCC27324D FET driver with $V_{CC}$ of 6V, driving a pulse transformer 118-n having a turns ratio of 1:2, and a driver transistor such as an ON Semiconductor or Motorola BSS138 FET coupling the pulse transformer to the input ports of switches 28-n, 36-n.

Light-emitting diodes (LEDs) 122, FIG. 10*d*, are coupled to the microprocessor 44 to provide a visual indication of the status of the burden tester 54. Illustratively, LEDs 122 are a Dialight 521-9450. Because the power supply in the illustrated embodiment had limited power, the circuit of FIG. 10*d* was provided to shift the voltage supply level from the +3.3 V supply to the μP 44 to the system's −6 V supply. In the circuit illustrated in FIGS. 10d, R53 and R54 are 3.16 KΩ resistors, Q42 and Q45 are type 2N2907 bipolar transistors, Q43 and Q44 are type BSS138 FETs, R55 and R56 are 46.4 KΩ resistors, and R58 and R59 are 316Ω resistors.

Figure 11A:
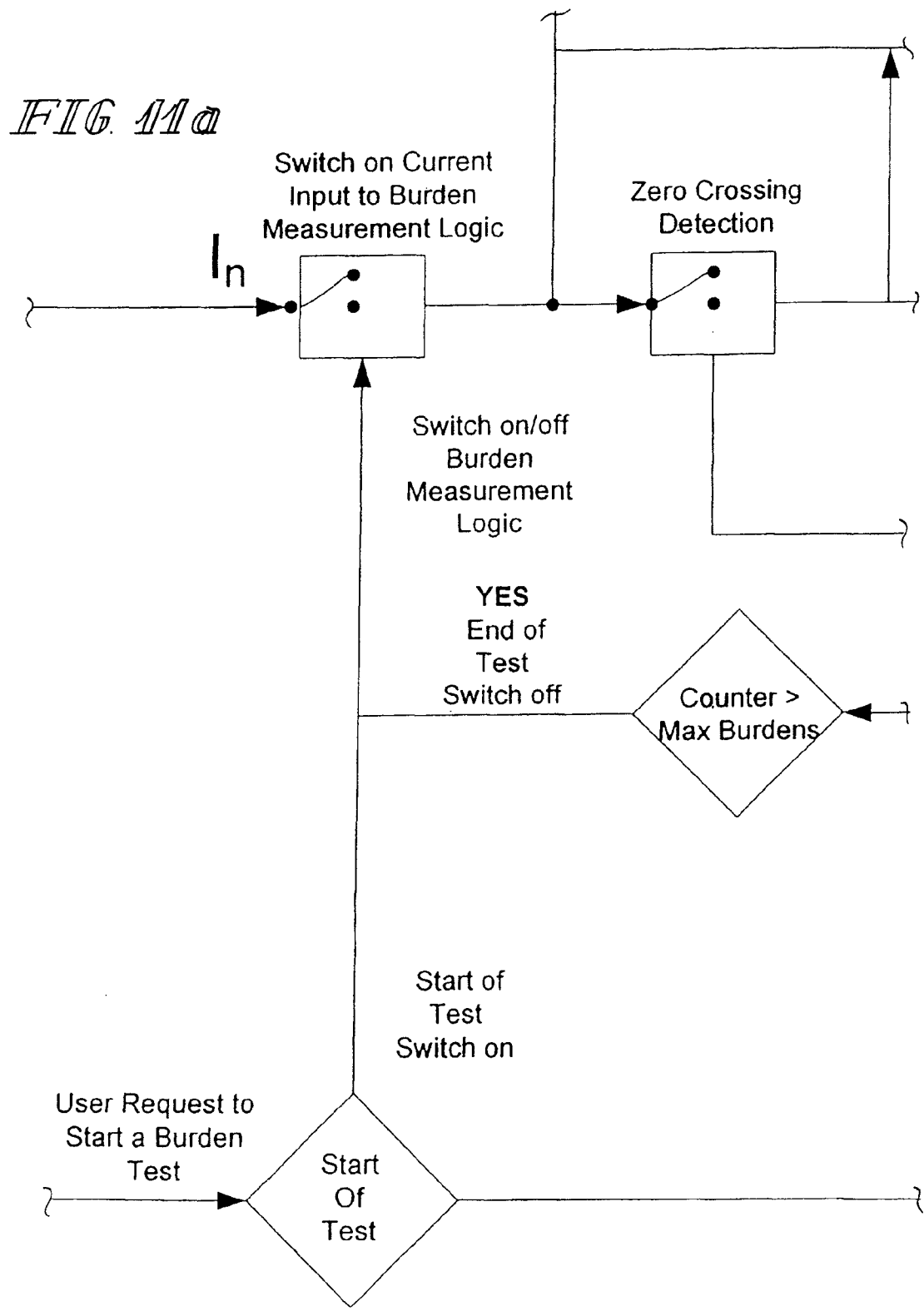
Figure 11B:
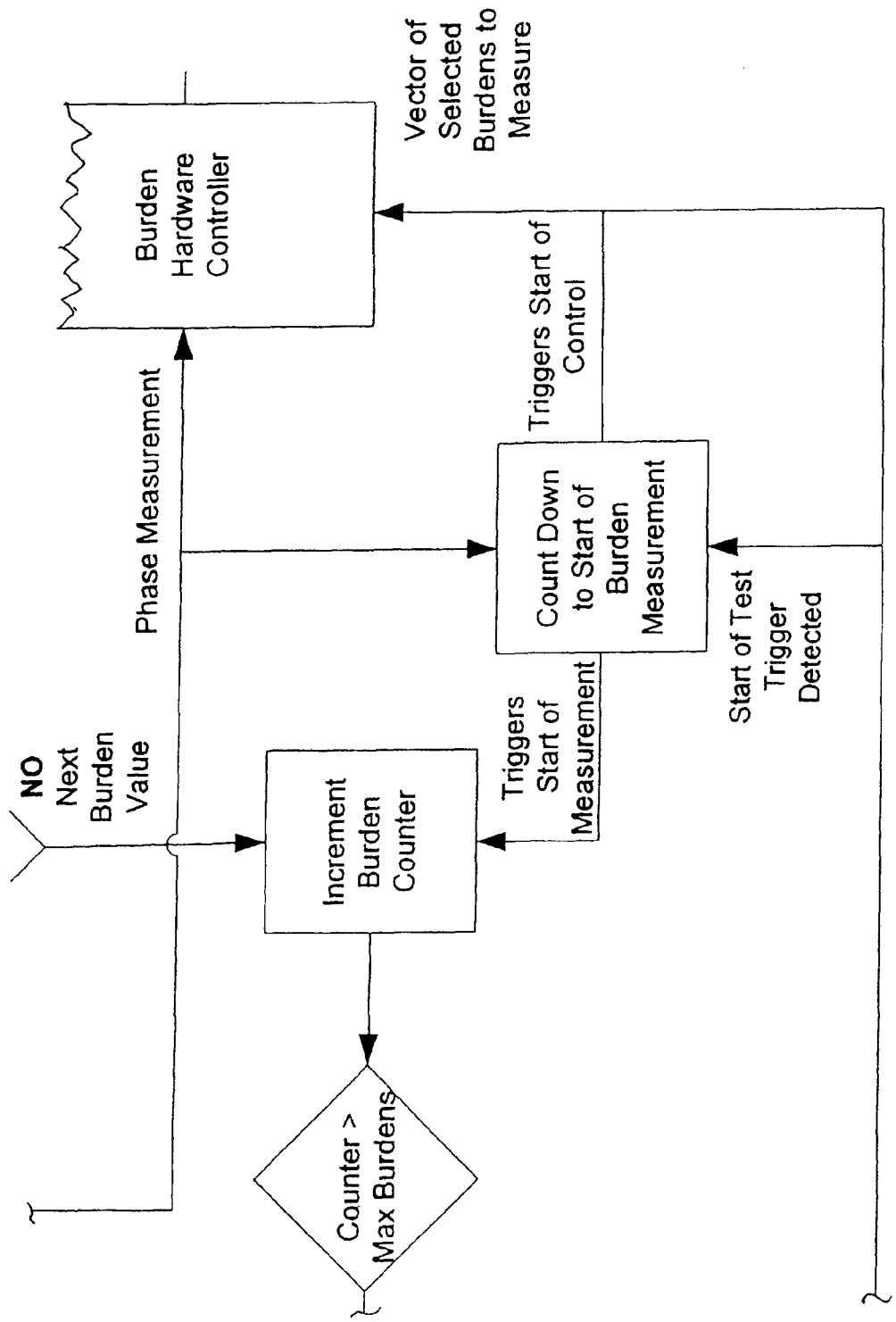
Figure 11C:
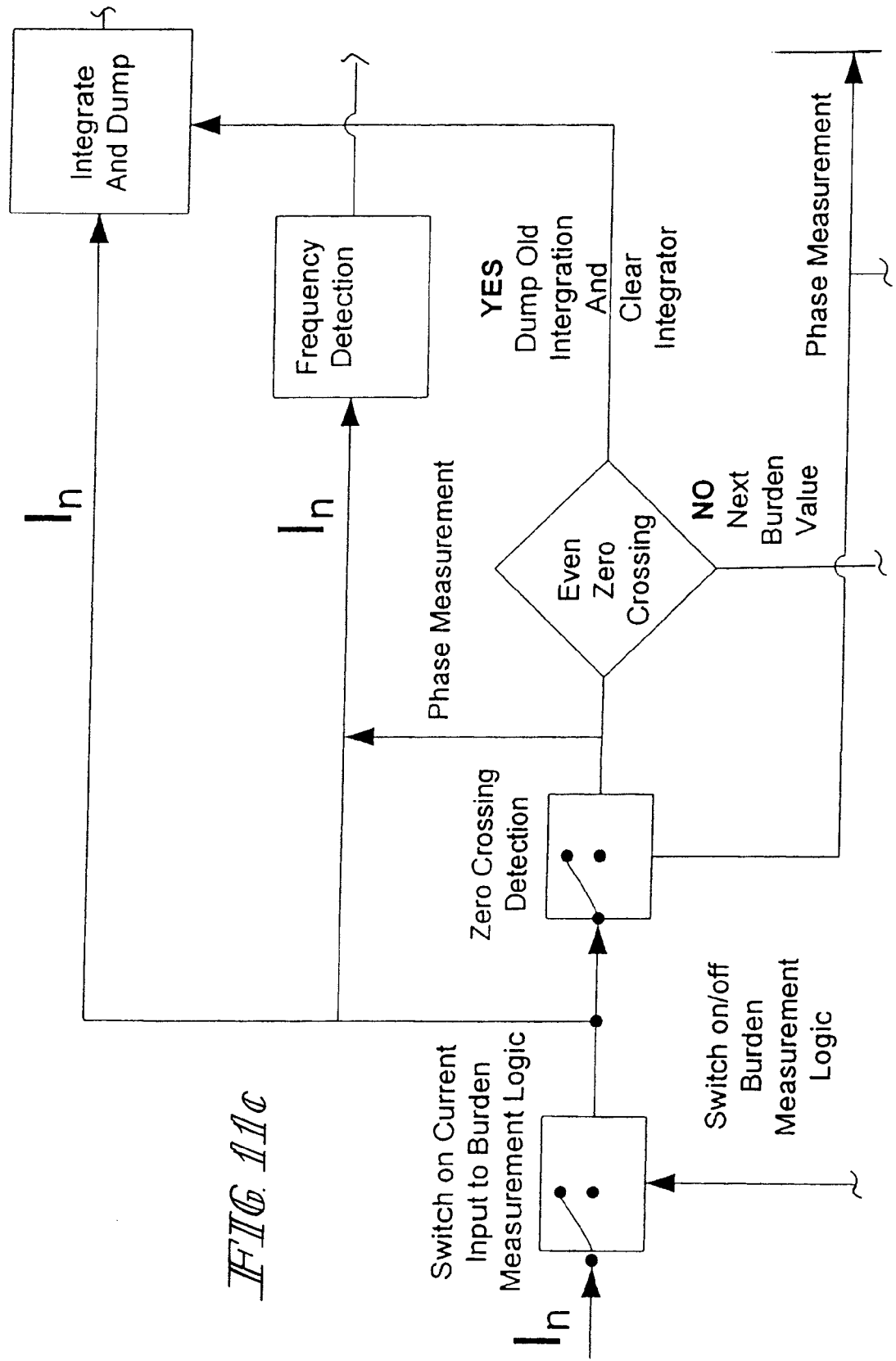
Figure 11D:
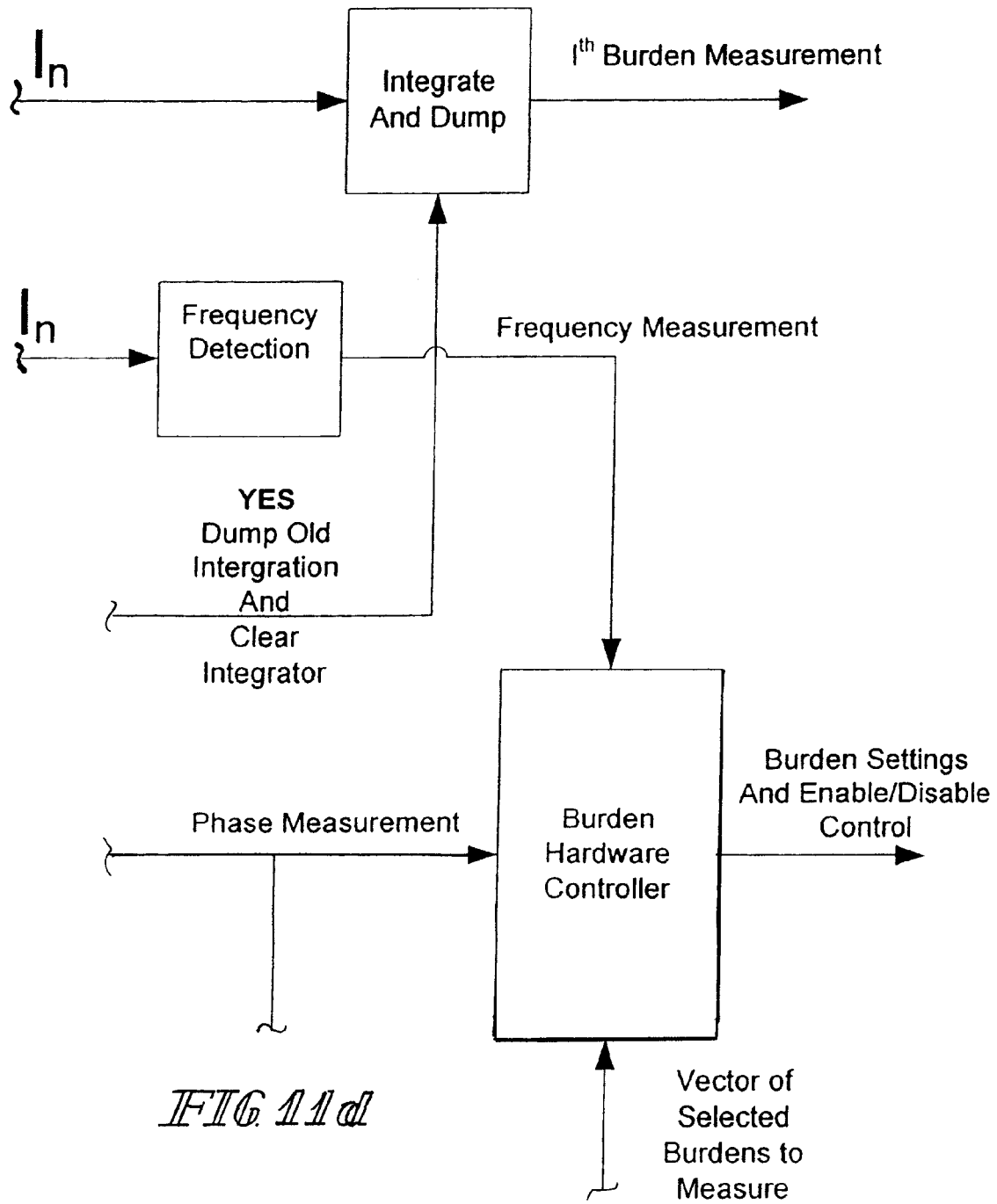

Turning now to FIGS. 11a-d, and particularly to FIG. 11a, a user request to start a burden test signals the start of a test. The burden measurement logic is switched on, FIGS. 11a and c, the "start of test" trigger is detected by the "count down to start of burden measurement" routine, FIG. 11b, which triggers "start of control." A vector of selected burdens to measure is provided to the burden hardware controller, FIGS. 11b and d. A burden counter is incremented, FIG. 11b, and current measurement inputs are provided, FIG. 11c, to a "zero crossing detection" routine, a "frequency detection" routine and an "integrate and dump" routine. The "zero crossing" routine also provides phase measurement output to an "even zero crossing" decision block, FIG. 11c, to the burden hardware (FIGS. 9a-d, 10a-d) controller, FIGS. 11b and d, and to the "count down to start of burden measurement" routine, FIG. 11b. If the zero crossing is not even, FIGS. 11c and b, the burden counter is incremented, FIG. 11b. If the zero crossing is even, FIG. 11c, indicating that a complete cycle of the input current or voltage has passed, the "integrate and dump" routine dumps the integrated value to storage and clears the integrator, and the ith burden measurement is stored, FIGS. 11c-d. If the burden counter is incremented, FIG. 11b, the routine asks, FIGS. 11a-b, if the counter has exceeded the maximum number of burdens 26, 32 with which the instrument transformer, 24, 30, 56 is to be tested. If not, the routine continues to run. If the burden counter has exceeded the maximum number of burdens, FIG. 11a, the program has reached the "end of test," and the routine is switched off.

The illustrated high accuracy current measurement device 62 includes a low burden, precision ratio, current measurement stage 59, FIG. 3d, coupled to a 24 bit ADC 53 coupled to DSP 46, FIG. 3b. While illustrated as embedded or incorporated into the device 40, μP 44 can also be external to the current measurement apparatus 40 and communicate with it, for example, via serial communication.

The microprocessor 44's and DSP 46's software configures the microprocessor 44 and DSP 46 to function together in a phase locked loop (hereinafter sometimes PLL), synchronizing measurements and burden commands with the zero crossings (see FIG. 4) of the current or voltage being measured. The software analyzes the spectrum of the measured current or voltage, providing harmonic and inter-harmonic information, measures the unburdened current/voltage and the burdened current/voltage and provides the percentage (%) difference measurement. The software also multiplexes between the high current path and the low current path. With a calibrated primary current clamp (not shown) attached to the pass-through connector, the software calculates the ratio of the primary current to the secondary current through, for example, 56-s. The software further communicates with the built-in user interface 57 of the current measurement device 62 or with an external interface (not shown) by serial communication. This system thus permits the user to interface with the transformer test apparatus 40. This includes, but is not limited to, creating, editing, and executing test sequences, collecting and displaying test results, and generating reports of gathered results.

To those skilled in the art it is understood that this is just one embodiment and that there are voltage and power analogs of the disclosed methods and apparatus. For instance, a parallel-connected IPRA with appropriate values may be substituted and used to test voltage transformers and protect the instrument transformer secondary circuit against short circuit rather than open circuit.

What is claimed is:

1. A method for testing a transformer including a winding, the method comprising operating a controller to generate a switching signal, supplying the switching signal to a solid state switch in circuit with a known test load, switching the solid state switch to place the known test load in circuit with the transformer, and measuring a signal through or across the transformer winding, monitoring zero crossings of the measured signal, and operating the controller to generate the switching signal substantially at the zero crossings of the measured signal.

2. The method of claim 1 further including analog-to-digital converting the measured signal.

3. The method of claim 2 further including locking a phase of the switching signal to a phase of the measured signal.

4. The method of claim 1 wherein supplying the switching signal to the solid state switch in circuit with the known test load comprises supplying the switching signal to the solid state switch in parallel with the known test load.

5. The method of claim 1 wherein supplying the switching signal to the solid state switch in circuit with the known test load comprises supplying the switching signal to the solid state switch in series with the known test load.

6. The method of claim 1 wherein supplying the switching signal to the solid state switch in circuit with the known test load comprises supplying the switching signal to the solid state switch in series-parallel with the known test load.

7. The method of claim 1 further including analog-to-digital converting the measured signal.

8. The method of claim 1 wherein supplying the switching signal to a solid state switch comprises supplying the switching signal to a field effect transistor.

9. Apparatus for testing a transformer including a winding, the apparatus comprising a controller for generating a switching signal, a known test load, a solid state switch in circuit with the known test load, the solid state switch having a control port coupled to the controller for supplying the switching signal to the solid state switch to place the known test load in circuit with the transformer, and a measurement device coupled to the known test load for measuring a signal through or across the transformer winding, monitoring zero crossings of the measured signal, and supplying the switching signal from the controller to the solid state switch substantially at the zero crossings of the measured signal.

10. The apparatus of claim 9 further including an analog-to-digital converter coupled to the transformer and to the measurement device for analog-to-digital converting the measured signal.

11. The apparatus of claim 10 wherein the controller is coupled to the known test load to lock a phase of the switching signal to a phase of the measured signal.

12. The apparatus of claim 9 wherein the solid state switch is coupled in series circuit with the known test load.

13. The apparatus of claim 9 wherein the solid state switch is coupled in parallel circuit with the known test load.

14. The apparatus of claim 9 comprising multiple solid state switches, the solid state switches coupled in series-parallel circuit with the known test load.

15. The apparatus of claim 9 wherein the solid state switch comprises a field effect transistor.

* * * * *